(12) United States Patent
Hwang et al.

(10) Patent No.: US 7,660,159 B2
(45) Date of Patent: Feb. 9, 2010

(54) METHOD AND DEVICE FOR PROGRAMMING CONTROL INFORMATION

(75) Inventors: Sang-won Hwang, Gyeonggi-do (KR); Jin-Yub Lee, Seoul (KR); Bum-Soo Kim, Gyeonggi-do (KR); Kwang-Yoon Lee, Gyeonggi-do (KR); Chan-Ik Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 132 days.

(21) Appl. No.: 10/998,987

(22) Filed: Nov. 30, 2004

(65) Prior Publication Data

US 2005/0248992 A1    Nov. 10, 2005

(30) Foreign Application Priority Data

May 6, 2004    (KR) .................. 10-2004-0031883

(51) Int. Cl.
*G11C 16/06* (2006.01)
(52) U.S. Cl. .................. 365/185.19; 365/185.22
(58) Field of Classification Search ............ 365/185.09, 365/185.19, 185.17, 185.22, 185.24
See application file for complete search history.

(56) References Cited

U.S. PATENT DOCUMENTS

| | | | |
|---|---|---|---|
| 5,473,563 A | 12/1995 | Suh et al. | |
| 5,642,309 A | 6/1997 | Kim et al. | |
| 5,696,717 A | 12/1997 | Koh | |
| 5,956,273 A | 9/1999 | Lin et al. | |
| 5,982,663 A | 11/1999 | Park | |
| 6,044,004 A * | 3/2000 | Kramer | 365/45 |
| 6,067,248 A | 5/2000 | Yoo | |
| 6,181,604 B1 | 1/2001 | Lu et al. | |
| 6,327,183 B1 * | 12/2001 | Pawletko et al. | 365/185.18 |

(Continued)

FOREIGN PATENT DOCUMENTS

DE    199 11 794 A1    9/2000

(Continued)

OTHER PUBLICATIONS

Kang-Deog Suh, et al., A 3.3 V 32 Mb NAND Flash Memory with Incremental Step Pulse Programming Scheme, *IEEE Journal of Solid-State Circuits*, (Nov. 1995), 30:11:1149-1156.

*Primary Examiner*—J. H. Hur
*Assistant Examiner*—Douglas King
(74) *Attorney, Agent, or Firm*—Harness, Dickey & Pierce, P.L.C.

(57) ABSTRACT

Methods and devices for programming control information perform a lower-speed programming of a given cell type in a first area of memory array, confirm a result of the lower-speed programming of the given cell type in the first area of memory array, and perform a higher-speed programming of the given cell type in a second area of memory array after confirming the result of the lower-speed programming. An initial programming voltage of the higher-speed programming may be different from that of the lower-speed programming. The first programming may be a lower-speed operation, such as the writing of data, and the second programming may be a higher-speed operation, such as the writing of control information.

37 Claims, 25 Drawing Sheets

U.S. PATENT DOCUMENTS

| | | | |
|---|---|---|---|
| 6,459,621 B1 * | 10/2002 | Kawahara et al. | 365/185.24 |
| 6,704,239 B2 | 3/2004 | Cho et al. | |
| 7,035,964 B1 | 4/2006 | Kohler et al. | |
| 2003/0133340 A1 | 7/2003 | Lee | |
| 2005/0248992 A1 * | 11/2005 | Hwang et al. | 365/185.28 |

FOREIGN PATENT DOCUMENTS

| | | |
|---|---|---|
| JP | 10-228786 | 8/1998 |
| JP | 2001-057091 | 2/2001 |

* cited by examiner

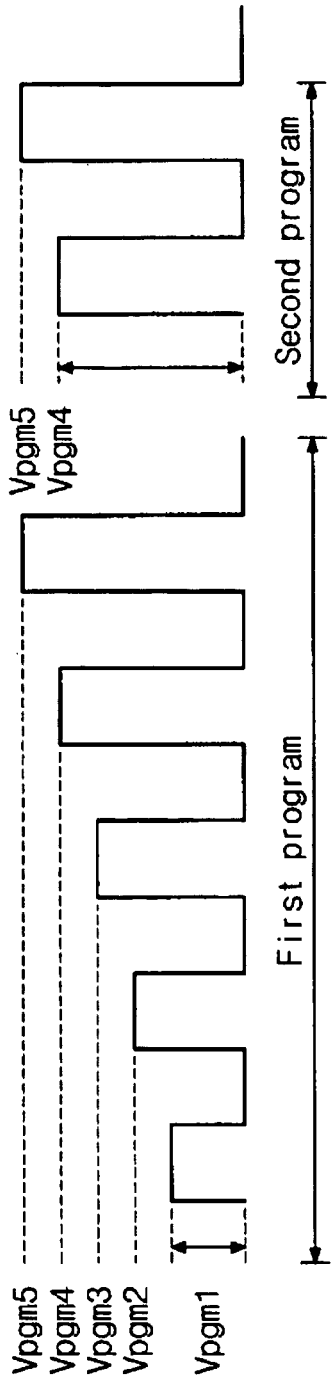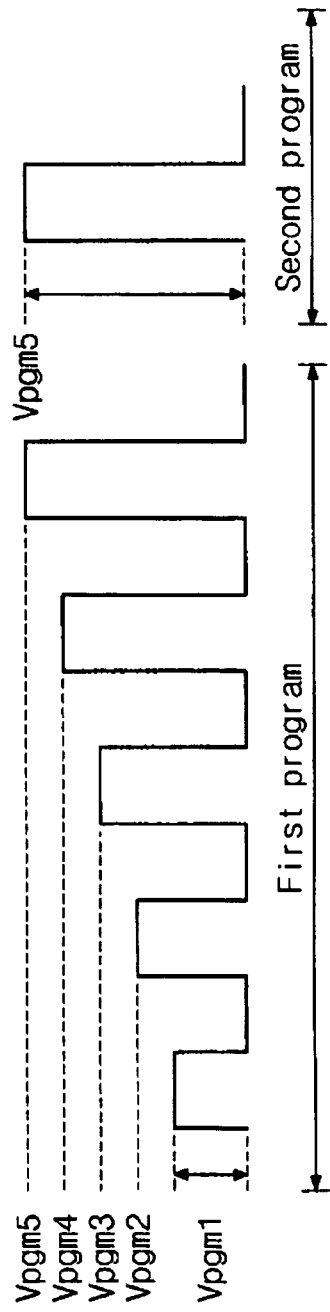

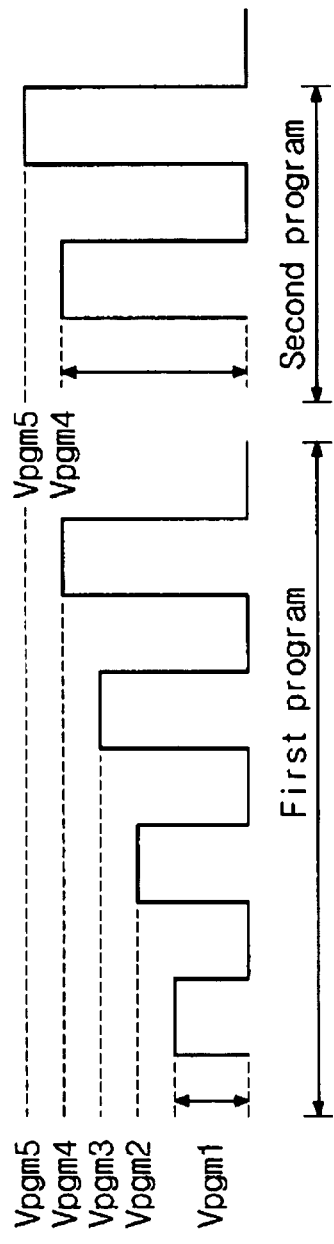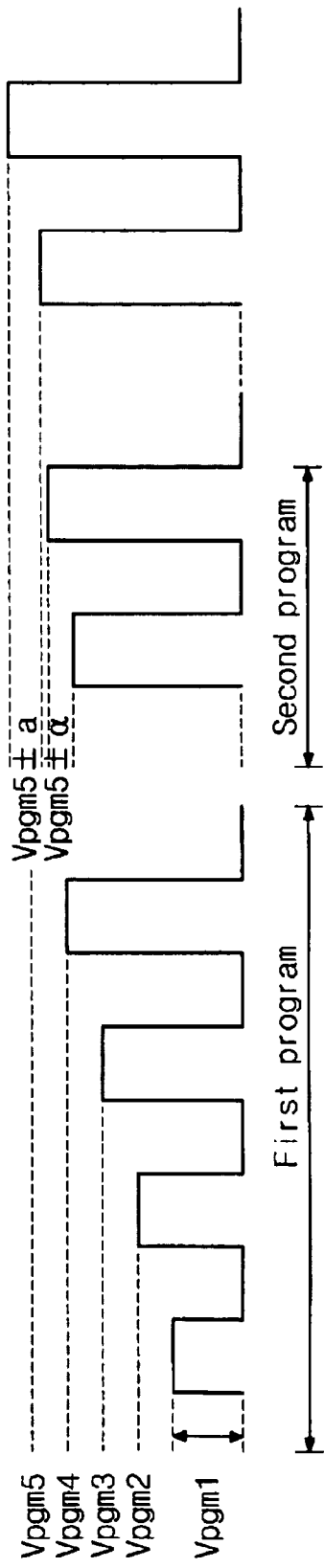

METHOD AND DEVICE FOR PROGRAMMING CONTROL INFORMATION

PRIORITY STATEMENT

This application claims the benefit under 35 U.S.C. §119(a) of Korean Patent Application No. 2004-0031883, filed on May 6, 2004, the contents of which are hereby incorporated by reference in their entirety.

BACKGROUND OF THE INVENTION

Recent developments in memory applications, such as mass storage, code memory, and other multimedia applications increasingly require memory devices with higher density. Mass storage applications may include memory cards (for example, for mobile computers), solid-state memory (for example, sturdy and/or reliable storage disks), digital cameras (for recording still or moving images and sound), and voice or audio recorders for recording near CD quality sound).

Code memory applications may include basic input/output systems (BIOS) or network applications (for example, memory in a personal computer, other terminal, router, or hub), telecommunications applications (for example, switches), mobile phone applications (for example, codes and/or data), and other electronic handheld information device applications (for example, codes and/or data for personal digital assistants (PDA), palm operating systems (POS), or personal communications assistants (PCA)).

Generally, mass storage applications use memory that is lower cost, higher density, and/or has better program/erase (P/E) cycling endurance, while code memory applications have faster random access and/or are executable in place (XIP).

Related art memories may include dynamic random access memory (DRAM), static random access memory (SRAM), and non-volatile memory (NVM). Non-volatile memory may include mask read only memory (ROM), erasable programmable read only memory (EPROM), electrically erasable programmable read only memory (EEPROM), flash memory (for example, flash erase EEPROM), and ferro-electric memory. Non-volatile memory does not lose data when power is lost, but generally does not permit random access and is generally slower than volatile memory.

Flash memory may be formed by a combination of erasable programmable read only memory (EPROM) and electrically erasable programmable read only memory (EEPROM). Flash memory may be NAND or NOR flash memory. Erase and program operations may be performed in a flash memory by the application of different voltages to each flash memory cell.

NAND flash memory may include a string of serially connected cells (for example, 16 cells may make up a string). The string may include one or more string select transistors. NAND flash memory may have a relatively small "on" cell current and hence, relatively slow sensing time (for example, 10-25 ms). NAND flash memory may perform a read operation by simultaneously sensing and latching a page unit (for example, 512 bytes) to a page buffers. NAND flash memory may read data from a page buffer latch at a relatively high speed (for example, 50 ns).

NAND flash memory may perform program and/or erase operations by tunneling (for example, Fowler-Nordheim (F-N) tunneling). A program operation may include a relatively fast serial data loading to a page buffer (for example, 50 ns), where cells (for example, 512 bytes) are simultaneously programmed. An erase operation may be a block unit erase where a number of pages (for example, 32 pages of 16 K bytes cells) are simultaneously erased.

Reliable F-N tunneling may be performed at approximately 10 mV/cm. which may result in lower power consumption, lower temperature dependence, more uniform program/erase operation, and/or easier device/voltage scaling.

NAND flash program operation may utilize a coupling between a gate and a channel. For example, a cell to be programmed may have a larger voltage difference between the gate and the channel than a cell not to be programmed. NAND flash program operation may also utilize a threshold voltage distribution, an example of which is shown in FIG. 1. FIG. 1 illustrates the relationship between a word line voltage $V_{word\ line}$ (for example, 0V), a read voltage $V_{read}$, and a cell voltage distribution Vth of an unprogrammed (or erased) cell and a programmed cell. In FIG. 1, Y-direction represents the threshold voltage of the storage cell and X-direction represents the number of cells at a certain threshold voltage.

Conventionally, a cell voltage distribution Vth has been controlled by an increment step pulse program (ISPP). Example ISPPs are shown in FIGS. 2a and 2b. FIG. 2a shows an example, related art ISPP, where the pulse width and amplitude remain the same. As shown, a voltage $V_0$ (for example, 18V) is applied during a program period (for example, 30 μs) and another voltage $V_1$ (for example, 1.2V) is applied during a verify period (for example, 5 μs). FIG. 2b shows an example, related art ISPP, where the pulse width remains the same, but the amplitude is varied. As shown, a voltage $V_0$ (for example, 15V) is applied during a first program period (for example, 30 μs) and incremented (by for example, 0.5 V) for each successive program period until a final voltage $V_n$ (for example, 19V) is reached. Another voltage $V_1$ (for example, 1.2V) is applied during each verify period (for example, 5 μs). In both FIGS. 2a and 2b, the total duration is around 250 μs. The cell voltage Vth variation and the number of cycles for FIG. 2b are advantageously smaller than for FIG. 2a.

FIG. 3 illustrates a related art over-programming problem. If the cell threshold voltage Vth is higher than $V_{read}$, a normal read operation for a NAND cell string may not be performed properly. Related art procedures exist to prevent over-programming during ISPP.

Related art procedures also utilize a flag or other mark to indicate that a normal cell program operation has been properly completed. A flag or other mark is used due to the relatively long programming time (around 250 μs as indicated above) for a NAND flash memory. During this relatively long programming time, a power-off or other similar interruption may occur. The flag or other mark is used to confirm that the program operation was completed. FIG. 4a illustrates an example where the flag or other mark (for example, a confirm mark) was completed and FIG. 4b illustrates an example where the normal programming and/or the flag or other mark were not completed.

In related art procedures, when the normal cell program operation or operations are performed, a determination is made as to whether the operation is complete, and if so, the flag or other mark is written. The flag or other mark may be written in a spare cell region of memory.

FIG. 5a illustrates a related art normal cell program and confirm cell program, as well as, a related art normal cell program time and confirm cell program time. As shown, both the related art normal cell program time and the confirm cell program time include loops of one program period and one verify period. FIG. 5b illustrates an example, related art memory location to which the normal cell program and the confirm cell program may be written. As illustrated in FIG. 5b, for the cell program write:

1 page/1 program time=512 byte/1 program time=4 k bit/ 250 μs (200 μs~300 μs)=16.4 bit/1 μs.

For the confirm mark write:

1 bit/1 program time=1 bit 250 μs=0.004 bit 1 μs.

As is clear from the above, the confirm mark write is less efficient than the cell program write.

SUMMARY OF THE INVENTION

Example embodiments of the present invention are directed to semiconductor devices, such as semiconductor memory devices, including, for example, flash memory, with reduced program time.

Example embodiments of the present invention are directed to programming methods with reduced program time.

Example embodiments of the present invention are directed to memory cell arrays, such as non-volatile memory cell arrays, with reduced program time.

Example embodiments of the present invention are directed to control circuits, such as program control circuits, with reduced program time.

In example embodiments, the present invention is directed to a method of programming including performing a lower-speed programming of a given cell type in a first area of memory array, confirming a result of the lower-speed programming of the given cell type in the first area of memory array, and performing a higher-speed programming of the given cell type in a second area of memory array after confirming the result of the lower-speed programming, where an initial programming voltage of the higher-speed programming is different from that of the lower-speed programming.

In example embodiments, the present invention is directed to a method of programming including performing a first programming of a given cell type in a first area of memory using a first programming method, confirming a result of the first programming of the given cell type in the first area of memory, and performing a second programming of the given cell type using a second programming method, different from the first programming method, when the result of the first programming is correct, where an initial programming voltage of the higher-speed programming is different from that of the lower-speed programming.

In example embodiments, the present invention is directed to a semiconductor memory device including a non-volatile memory cell array including a first area and a second area and a controller for performing a lower-speed programming of a given cell type in a first area of the non-volatile memory cell array, confirming a result of the lower-speed programming of the given cell type of the first area, and performing a higher-speed programming of the given cell type in a second area of the non-volatile memory cell array when the result of the lower-speed programming is correct, where an initial programming voltage of the higher-speed programming is different from that of the lower-speed programming.

In example embodiments, the present invention is directed to a semiconductor memory device including a non-volatile memory cell array including a first area and a second area, the first area including a plurality of memory cell strings, where a string includes a number of memory cells and the number of cells to be programmed in the string is smaller than all of the memory cells in the string and the threshold voltage of a programmed cell is independent of a Vread voltage level and a second area which includes a plurality of memory cell strings, where all of the memory cells in the string can be programmed.

BRIEF DESCRIPTION OF THE DRAWINGS

The present invention will become more fully understood from the detailed description given below and the accompanying drawings, which are given for purposes of illustration only, and thus do not limit the invention.

FIGS. 9a-9d illustrate the use of two different programming methods in accordance with other example embodiments of the present invention.

Figure 1:
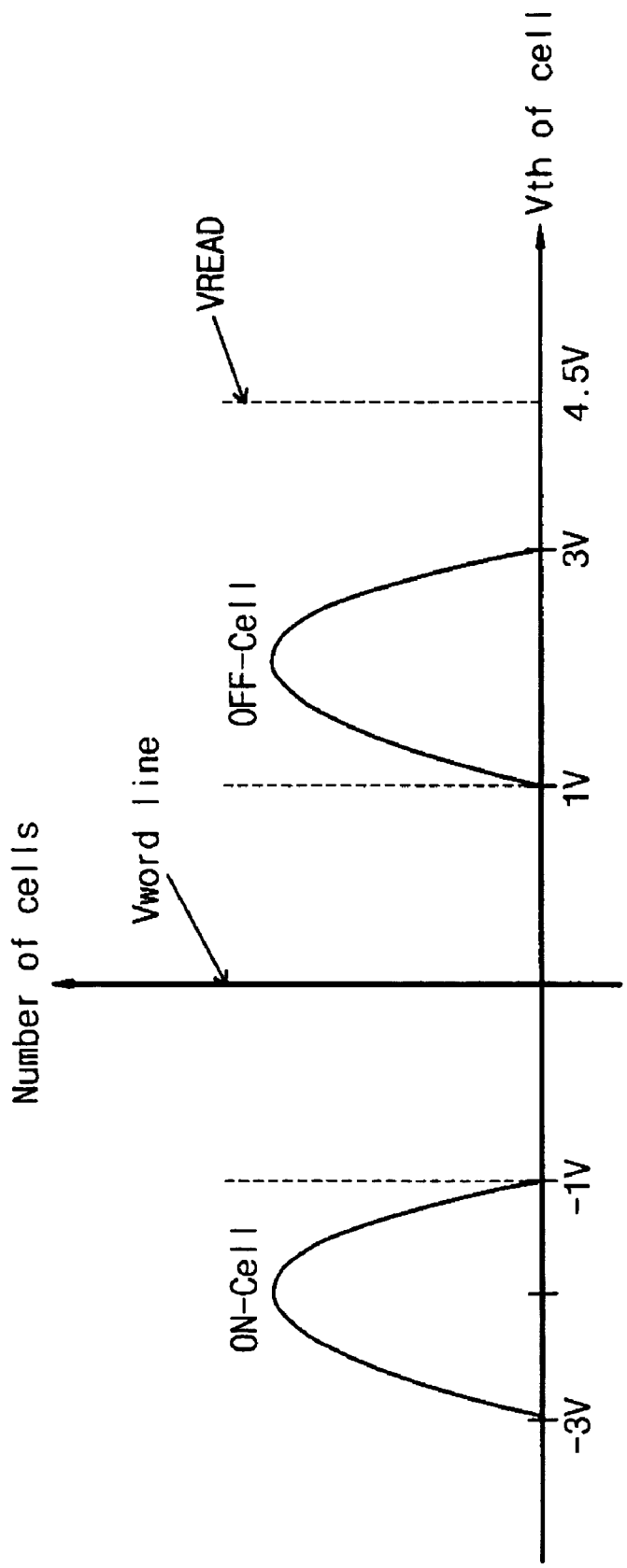
FIG. 1 illustrates a relationship between a word line voltage $V_{word\ line}$, a read voltage $V_{read}$, and a cell voltage distribution Vth of a unprogrammed (or erased) cell and a programmed cell.
Figure 2A:
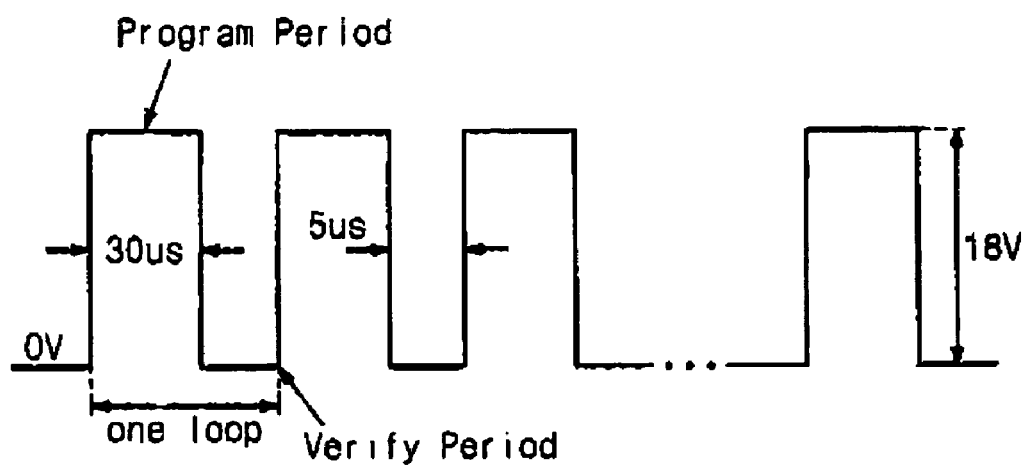
FIGS. 2a and 2b illustrate two example, related art increment step pulse programs (ISPPs).
Figure 2B:
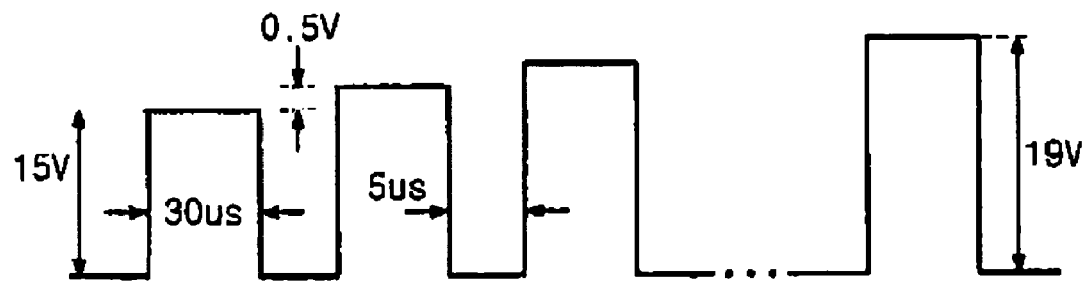
Figure 3:
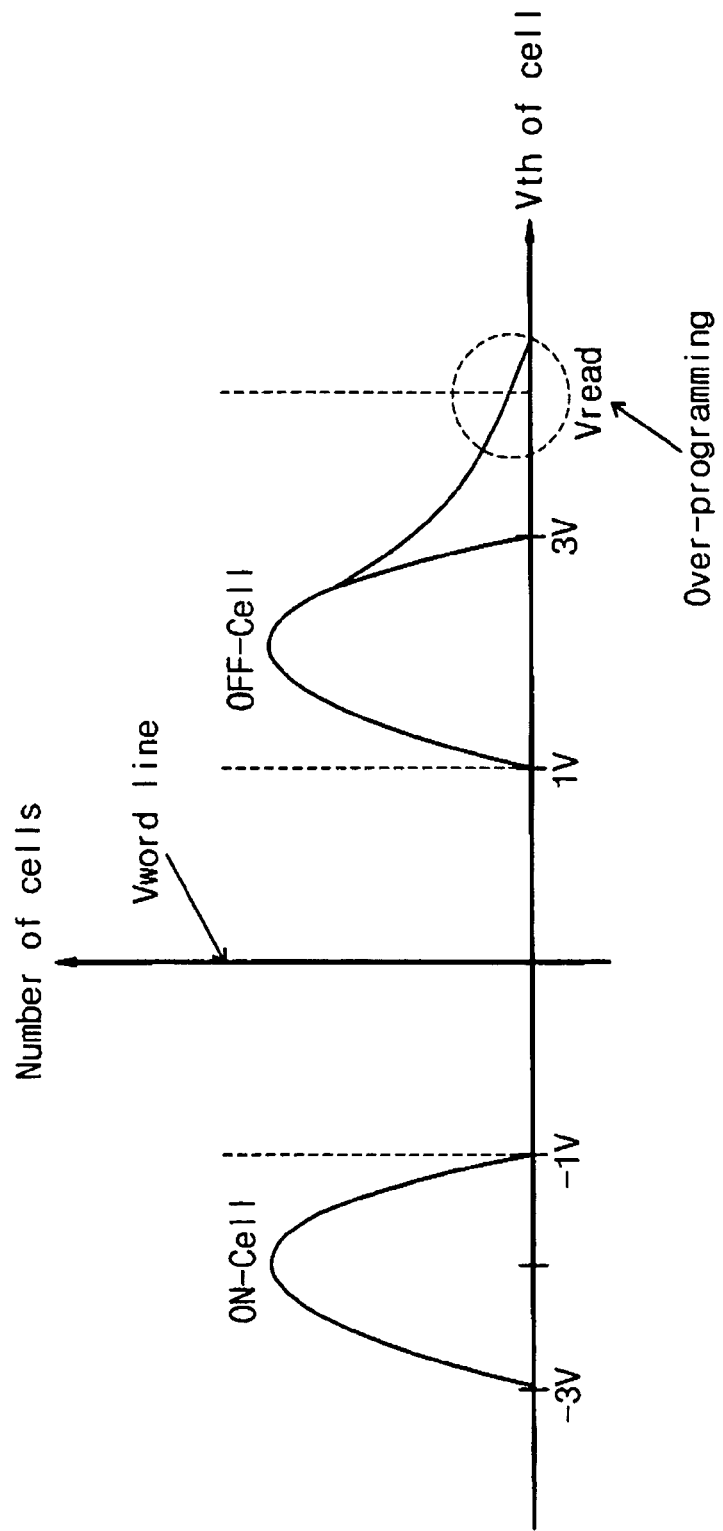
FIG. 3 illustrates a related art over-programming problem.
Figure 4A:
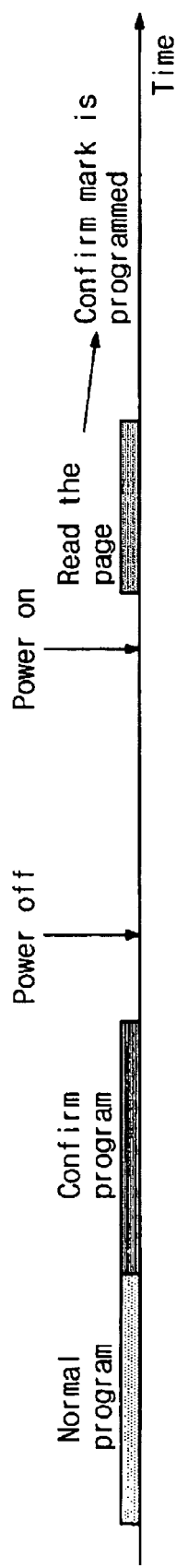
FIG. 4a illustrates an example where a confirm mark was successfully completed and FIG. 4b illustrates an example where a confirm mark was not successfully completed.
Figure 4B:
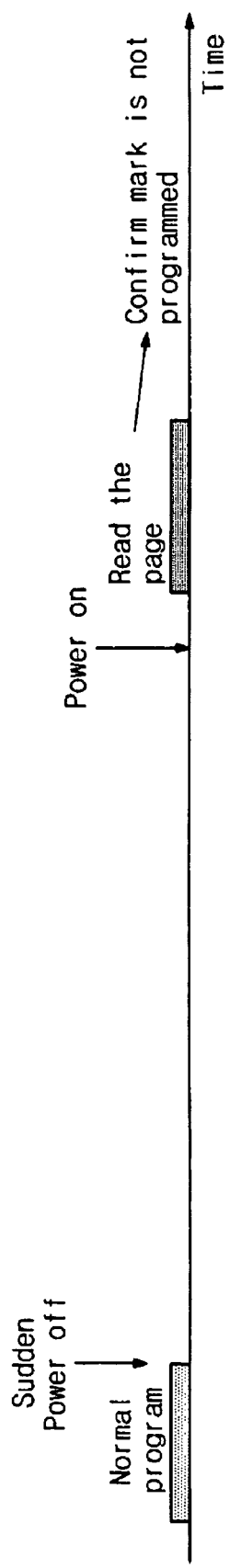
Figure 5A:
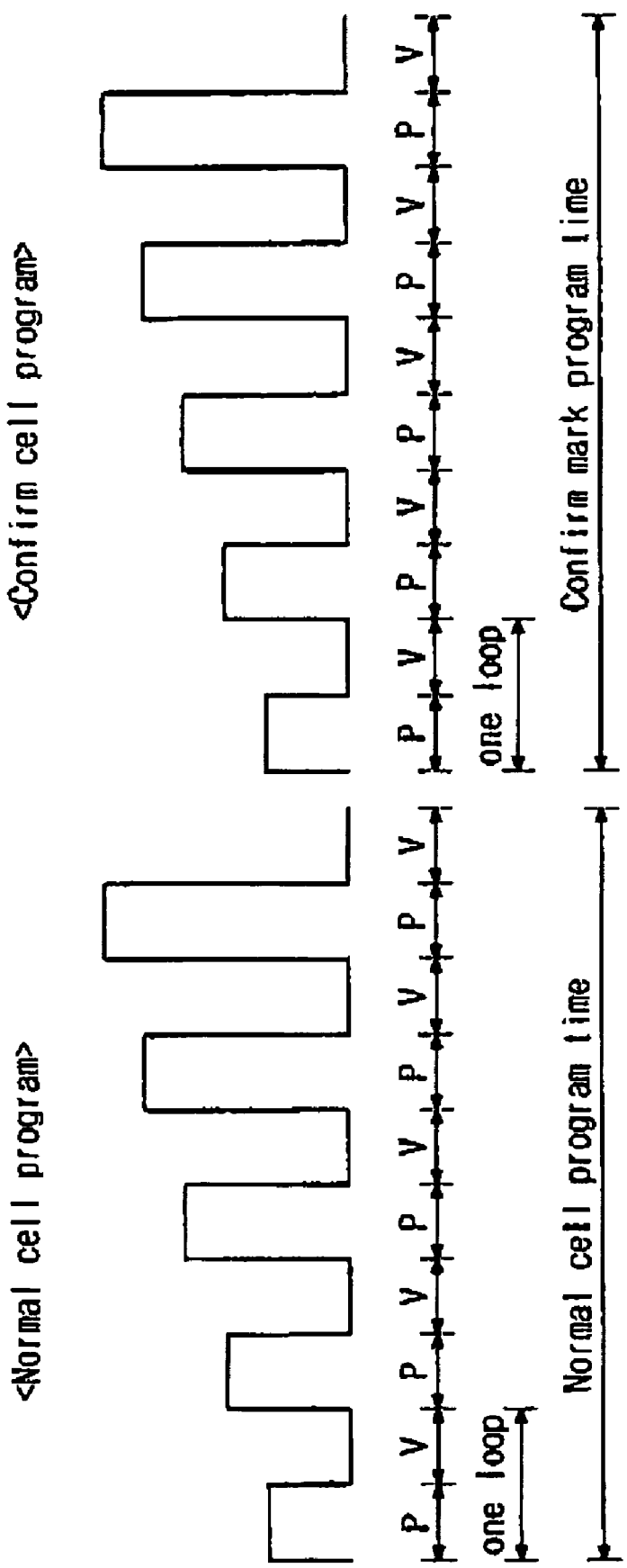
FIG. 5a illustrates a related art normal cell program and confirm cell program and a related art normal cell program time and confirm cell program time.
Figure 5B:
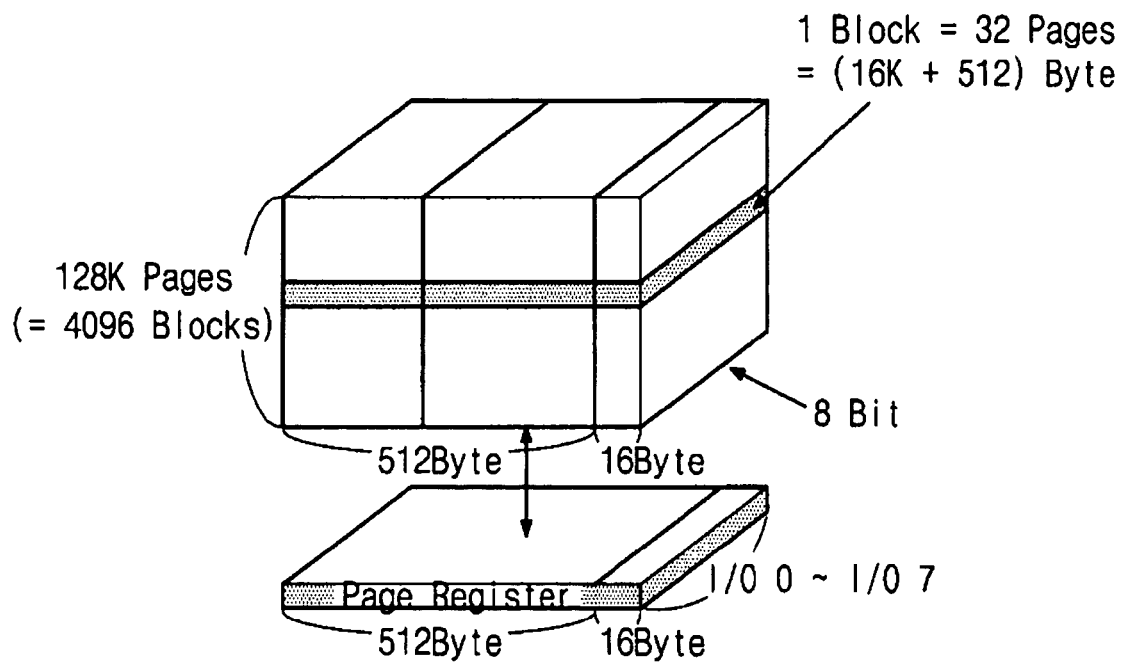
FIG. 5b illustrates the memory location to which the related art normal cell program and the related art confirm cell program may be written.

It should be noted that these Figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

DETAILED DESCRIPTION OF EXAMPLE EMBODIMENTS OF THE PRESENT INVENTION

In example embodiments, the present invention is directed to a method and device for writing a flag, a control flag, a mark, a control mark, or other control information with a programming method different from the programming method used to write cell data.

In example embodiments, the present invention is directed to a method and device for writing a flag, a control flag, a mark, a control mark, or other control information with a programming method which is more efficient for the flag, the control flag, the mark, the control mark, or other control information and writing cell data with a programming method which is more efficient for the cell data.

In example embodiments, the present invention is directed to a method and device for writing a flag, a control flag, a mark, a control mark, or other control information with a programming method which is faster for the flag, the control flag, the mark, the control mark, or other control information and writing cell data with a programming method which is slower for the cell data.

In example embodiments, the present invention is directed to a method and device for writing a flag, a control flag, a mark, a control mark, or other control information with a programming method which has fewer programming voltage pulses than the programming method for writing cell data. In example embodiments, the present invention is directed to a method and device for writing a flag, a control flag, a mark, a control mark, or other control information with a programming method which has a higher initial programming voltage pulse than an initial programming voltage pulse of a programming method for writing cell data.

In example embodiments, the present invention is directed to a method and device for writing a flag, a control flag, a mark, a control mark, or other control information with a programming method which has a higher initial programming voltage pulse and fewer programming voltage pulses than a programming method for writing cell data.

In example embodiments, the present invention is directed to a method and device where different areas of a cell array are written with different programming methods.

In example embodiments, the present invention is directed to a method and device where each programming method is more efficient for the type of data stored therein.

In example embodiments, the present invention is directed to a method and device where some areas of a cell array are written with a faster programming method and other areas of the cell array are written with a slower programming method.

In example embodiments, the present invention is directed to a method and device where different areas of a cell array have different program cycle times. In example embodiments, the present invention is directed to a method and device where some areas of a cell array have a longer program cycle time and other areas of the cell memory have a shorter program cycle time.

In example embodiments, the present invention is directed to a method and device where over-programming is permitted in some areas of a cell array but not in other areas of the cell memory.

Figure 6A:
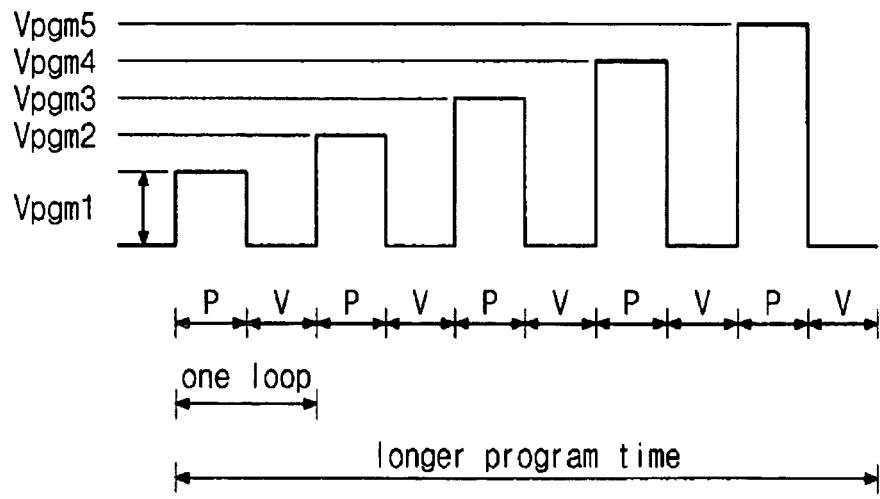
FIGS. 6a, 6b, and 6c illustrate the use of different programming methods for a flag, a control flag, a mark, a control mark, or other control information and cell data in accordance with example embodiments of the present invention.
Figure 6B:
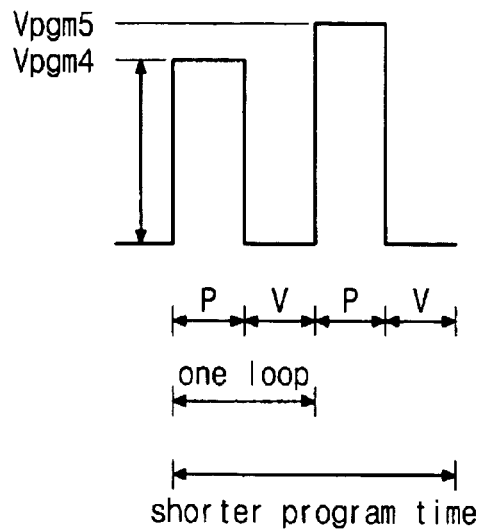
Figure 6C:
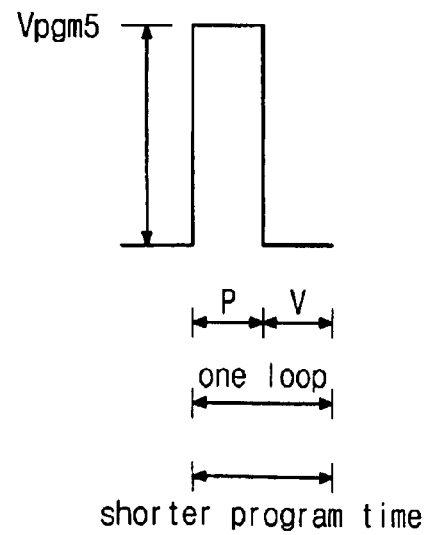

FIGS. 6a, 6b, and 6c illustrate the use of different programming methods for a flag, a control flag, a mark, a control mark, or other control information and cell data in accordance with an example embodiment of the present invention. As shown in FIG. 6a, the programming method for cell data may begin with a relatively low initial voltage, for example, Vpgm1 and may include several incremental step pulses, for example, four increments as shown in FIG. 6a.

In contrast, as shown in FIGS. 6b and 6c, the programming method for a flag, a control flag, a mark, a control mark, or other control information may begin with a relatively high initial voltage, for example, Vpgm4 as shown in FIG. 6b or Vpgm5 as shown in FIG. 6c, and may include fewer incremental step pulses, for example, one increment as shown in FIG. 6b or no increments as shown in FIG. 6c. The programming method for cell data may be characterized as a normal (or slower) programming method and the programming method for the flag, the control flag, the mark, the control mark, or other control information may be characterized as a faster programming method because the programming method for cell data has a longer programming time and the programming method for the flag, the control flag, the mark, the control mark, or other control information has a shorter programming time, as shown in FIGS. 6a-6c.

In an example embodiment, the programming method illustrated in FIG. 6a may be characterized as a full ISPP, the programming method illustrated in FIG. 6b may be characterized as a partial ISPP, and the programming method illustrated in FIG. 6c may be characterized as a one-shot programming method. The full ISPP may lengthen programming time, reduce or minimize cell Vth dispersion, and/or reduce or prevent over-programming. The partial ISPP and the one-shot programming method may shorten programming time, increase cell Vth dispersion, decrease storage efficiency, and/or increase the possibility of over-programming. In another embodiment, the partial ISPP and/or the one-shot programming method may be applied to cell data.

Figure 7A:
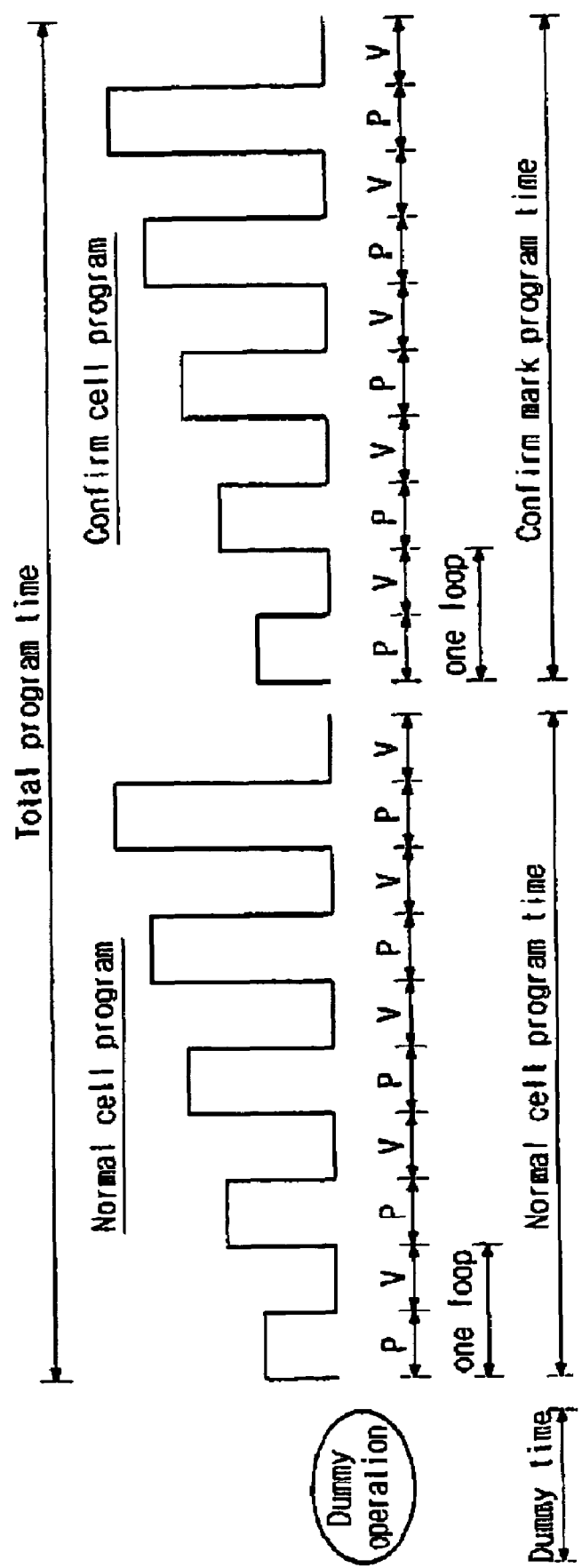
FIGS. 7a and 7b illustrate a comparison of an example embodiment of the present invention and the related art.
Figure 7B:
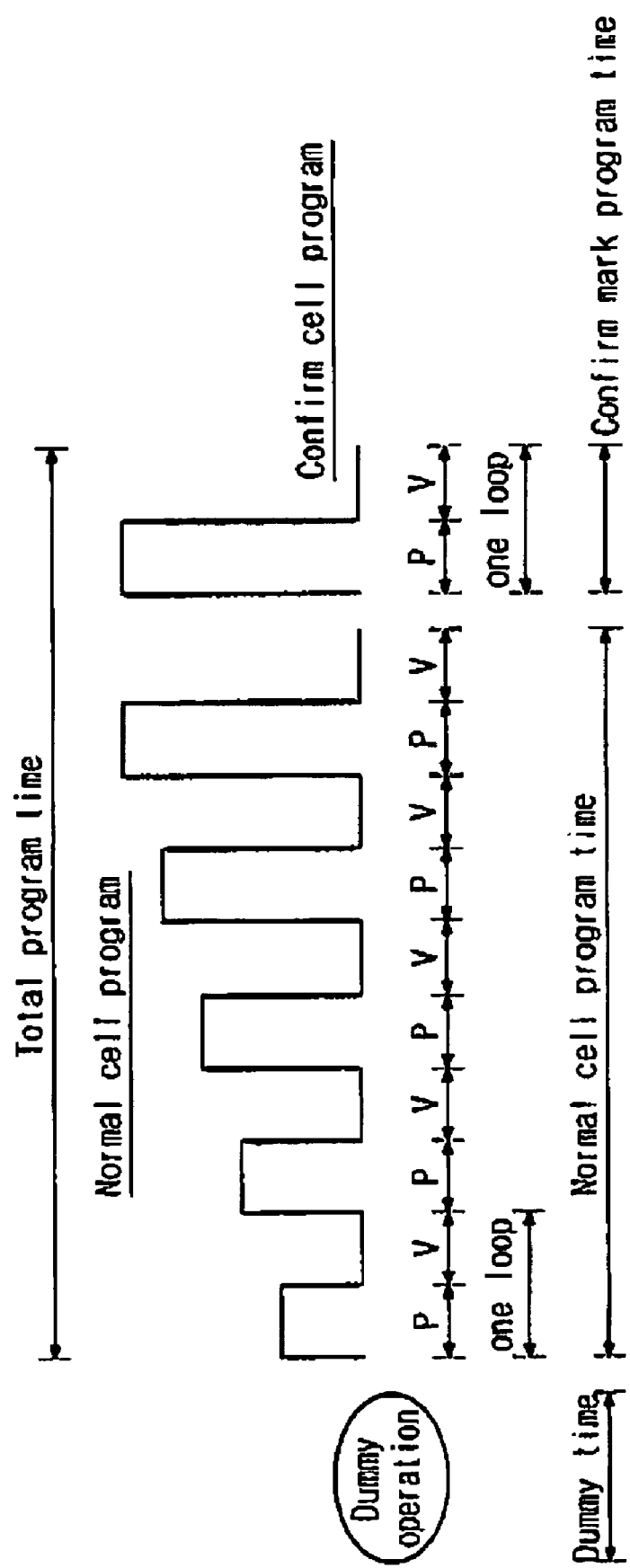

FIGS. 7a and 7b illustrate a comparison of an example embodiment of the present invention and the related art, where the example embodiment implements a one-shot programming method. As is clearly illustrated, the normal cell program time may be the same if both implement the same, full ISPP. However, in an example embodiment of the present invention, the confirm cell program time, and hence the total program time, may be shortened by use of an example one-shot programming method, where a voltage of the one shot is equal to the voltage of the last voltage applied in the full ISPP.

Figure 8A:
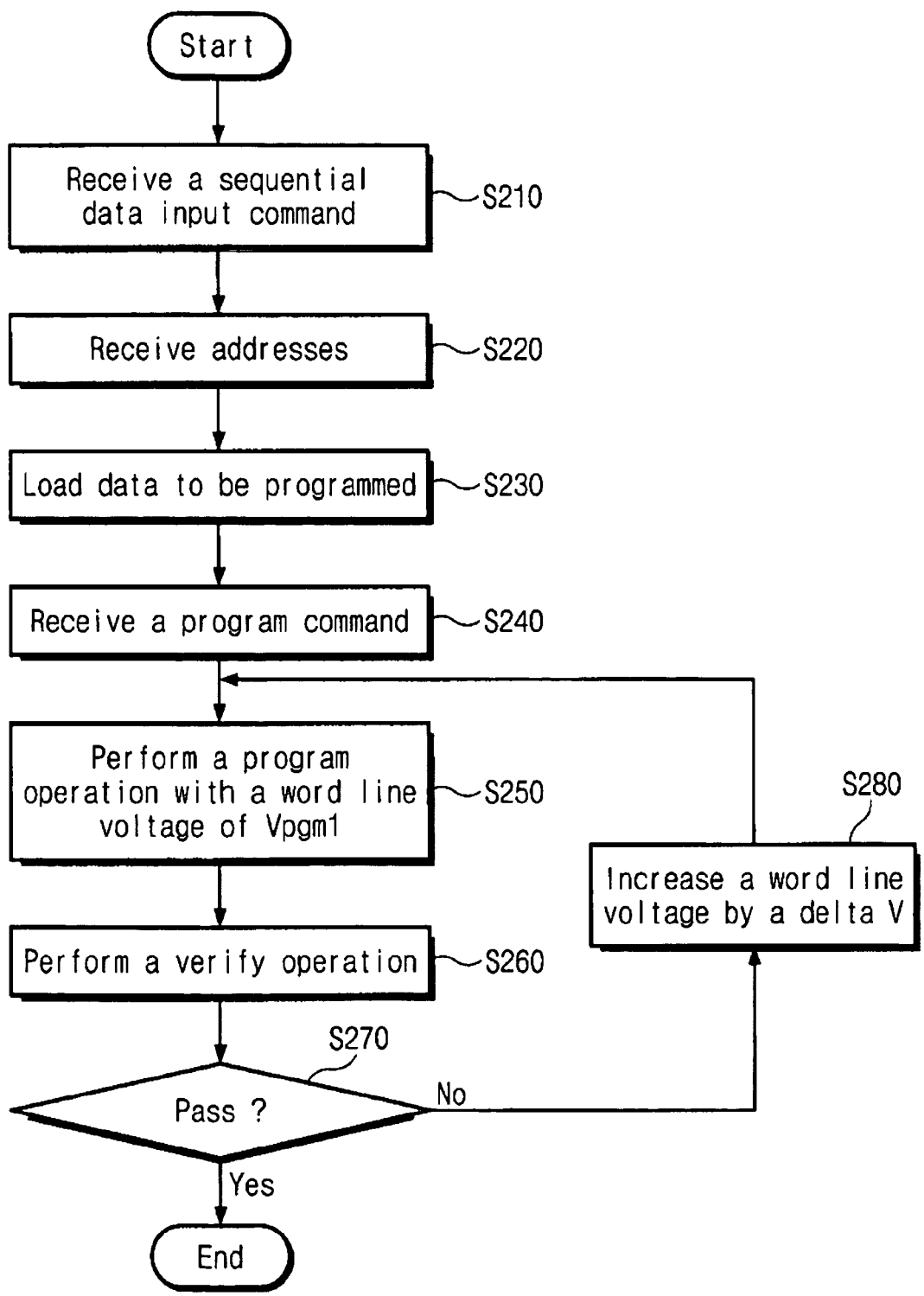
FIGS. 8a and 8b are flowcharts illustrating methods according to an example embodiments of the present invention.
Figure 8B:
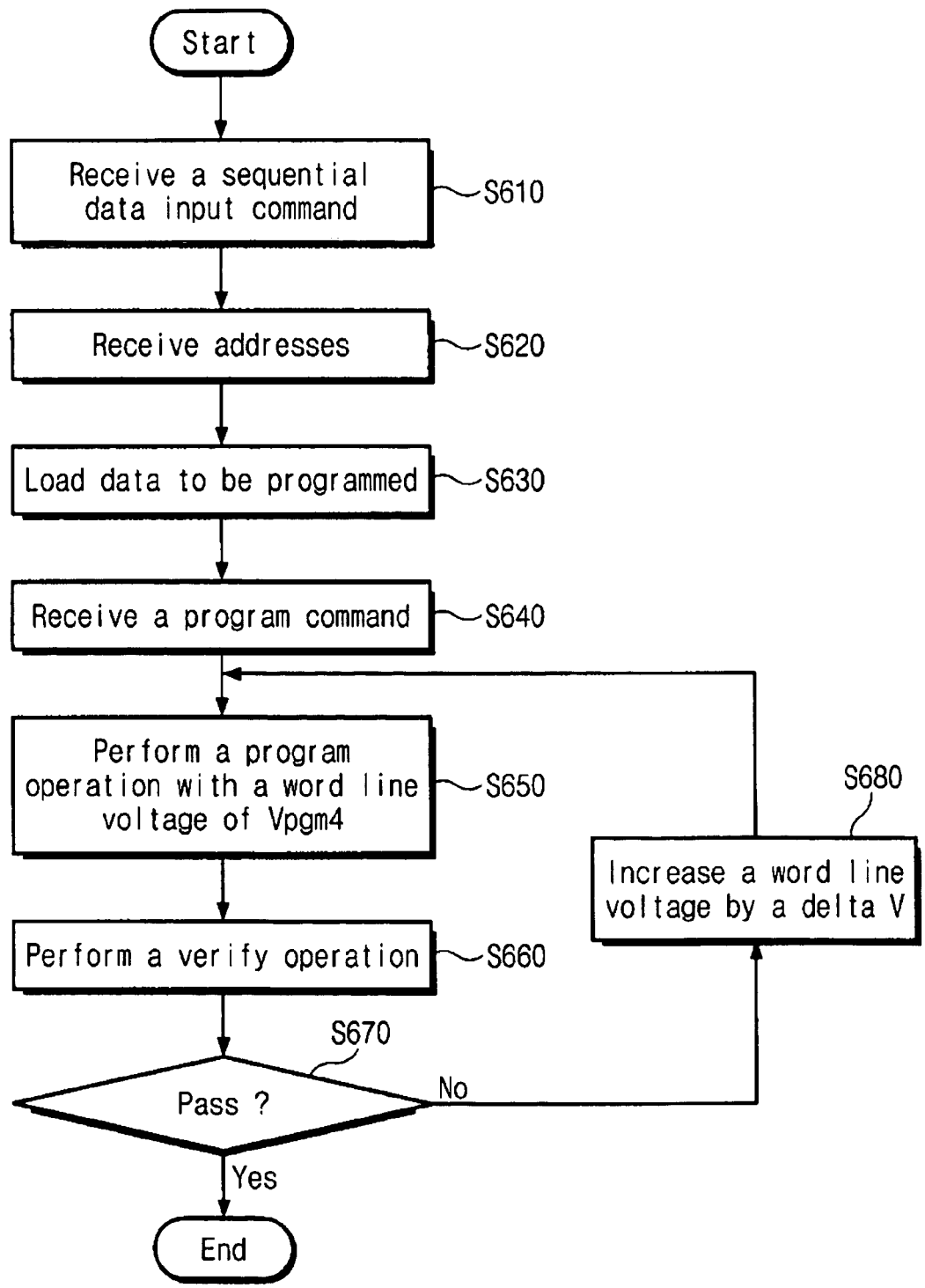

FIGS. 8a and 8b are flowcharts illustrating a method according to an example embodiment of the present invention. FIG. 8a is a flowchart illustrating a method of programming cell data according to an example embodiment of the present invention and FIG. 8b is a flowchart illustrating a method of programming a flag, a control flag, a mark, a control mark, or other control information according to an example embodiment of the present invention.

As shown in FIG. 8a, an example method of programming cell data may include receiving a command, such as a sequential data input command, at 210 and receiving an address at 220. At 230, the data to be programmed may be loaded and at 240, the program command may be received. At 250, the method may perform a program operation with a word line voltage of Vpgm1. At 260, the method may perform a verify operation. If successful at 270, the method may end. If not, flow may proceed to 280, where the word line voltage may be increased by a ΔV and then to 250, to perform the program operation with the new word line voltage.

As shown in FIG. 8b, an example method of programming a flag, a control flag, a mark, a control mark, or other control information may include receiving a command, such as a sequential data input command, at 610 and receiving an address at 620. At 630, the data to be programmed may be loaded and at 640, the program command may be received. At 650, the method may perform a program operation with a word line voltage of, for example, Vpgm4. At 660, the method may perform a verify operation. If successful at 670, the method may end. If not, flow may proceed to 680 where the word line voltage may be increased by a ΔV and then to 650 to perform the program operation with the new word line voltage.

FIGS. 9a-9d illustrate the use of two (or more) different programming methods in accordance with other example embodiments of the present invention. FIG. 9a is essentially the combination of FIGS. 6a and 6b. FIG. 9b is essentially the combination of FIGS. 6a and 6c. Both FIGS. 9a and 9b are incremented by programming step. In contrast, both of FIGS. 9c and 9d are incremented based on initial voltage. As shown in FIG. 9c, an initial voltage of the second program may be the same as a last voltage from the first program and is maintained constant. In FIG. 9d, an initial voltage of the second program may be different from a last voltage from the first program and may be varied by an example amount indicated by ±a or ±α, which may be a fixed voltage or based on any previous voltage, for example, the next to last or last voltage of the first program.

Figure 10A:
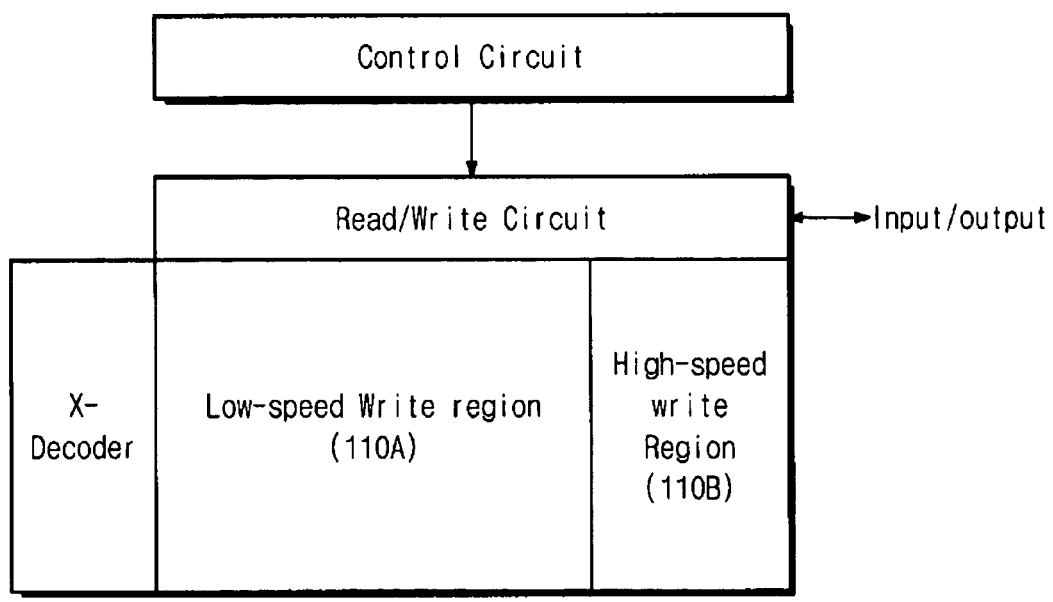
FIGS. 10a-10d illustrate cell arrays in accordance with an example embodiment of the present invention.
Figure 10B:
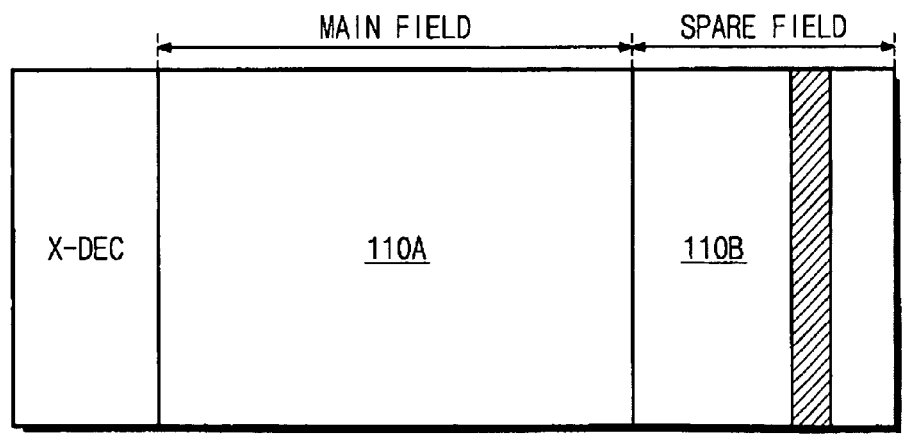
Figure 10C:
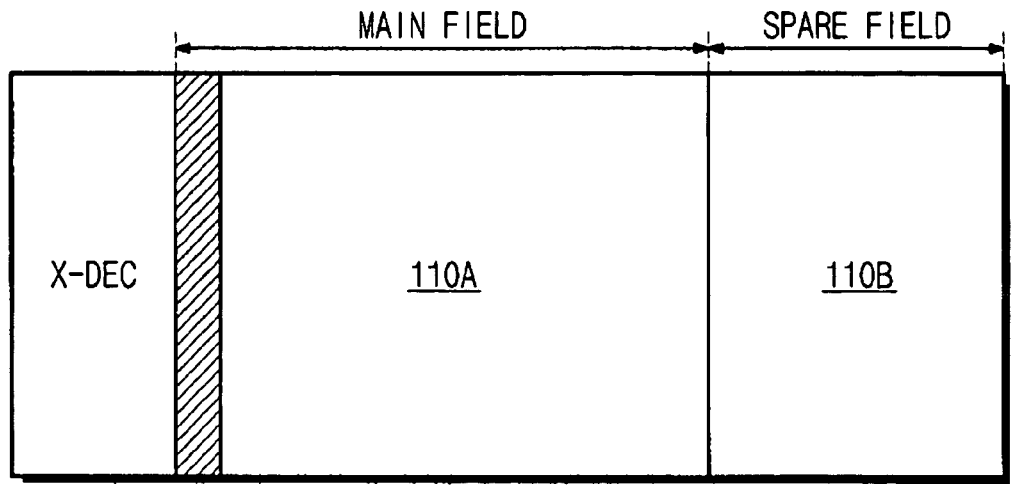
Figure 10D:
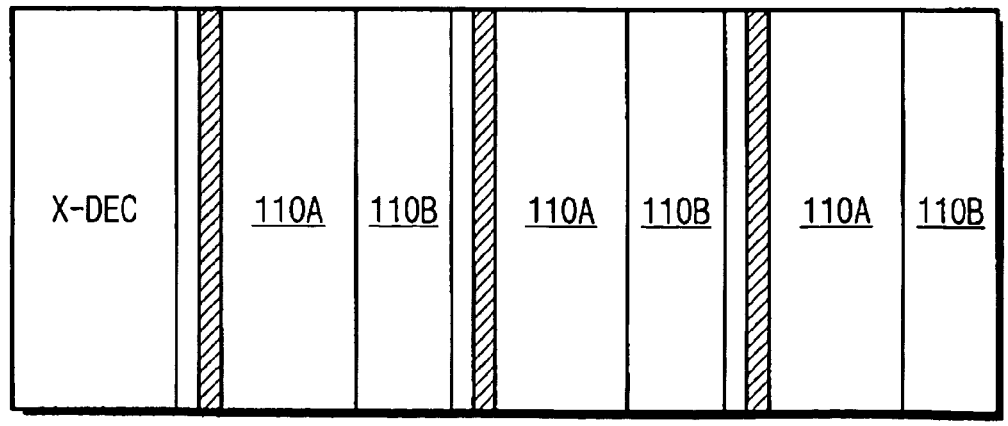

FIGS. 10a-10d illustrate a cell array in accordance with an example embodiment of the present invention. FIG. 10a illustrates the overall cell array in accordance with an example embodiment of the present invention and FIGS. 10b-10d illustrate three examples writing of a flag, a control flag, a mark, a control mark, or other control information in a main field and/or a spare field of an example cell array region in accordance with example embodiments of the present invention.

As shown in FIG. 10a, a cell array may be controlled by a control circuit, a read/write circuit, and/or an X-decoder. This hardware is known to one of ordinary skill in the art. A cell array may have two or more array regions. FIG. 10a illustrates a cell array including a lower speed write region 110A and a higher speed write region 110B.

In an example embodiment, the lower speed write region 110A may be a main cell storage field and may be written therein with normal or lower speed programming, may be written therein with a full ISPP, and/or may not permit over-programming. In an example embodiment, the higher speed write region 110B may be a spare cell storage field, may be written therein with faster speed programming, may be written therein with a reduced ISPP, may be written therein with one-shot programming, and/or may permit over-programming.

As shown in FIG. 10b, in one example, a flag, a control flag, a mark, a control mark, or other control information (identified by the shaded portion of FIG. 10b) may be written entirely in the lower speed write region 110A. As shown in FIG. 10c, in another example, a flag, a control flag, a mark, a control mark, or other control information (identified by the shaded portion of FIG. 10c) may be written entirely in the higher speed write region 110B. As shown in FIG. 10d, in another example, a flag, a control flag, a mark, a control mark, or other control information (identified by the shaded portion of FIG. 10d) may be written in successive lower speed write regions 110A. It is noted that other alternatives are also possible, including writing a flag, a control flag, a mark, a control mark, or other control information in successive higher speed write regions 110B.

Figure 11A:
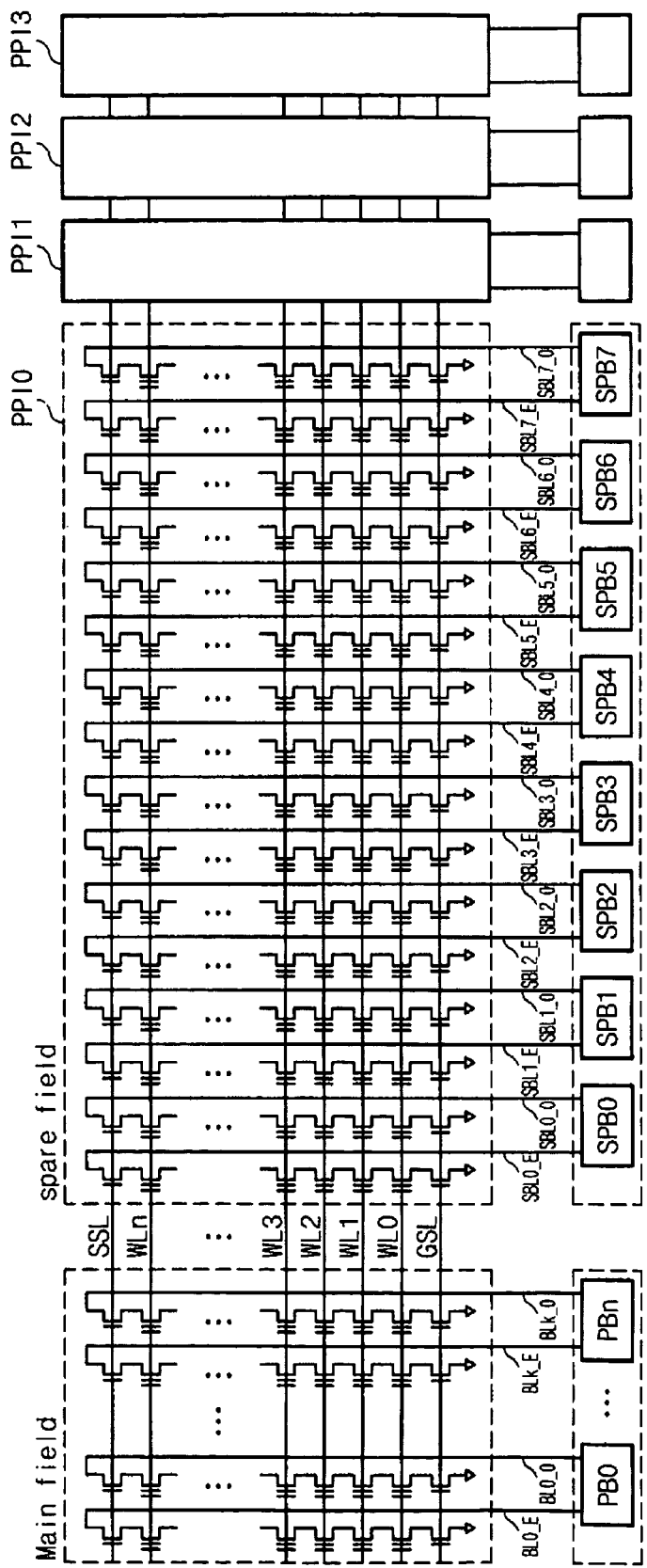
FIG. 11a illustrate a main field and a spare field of cell array regions in accordance with example embodiments of the present invention, in more detail.

FIG. 11a illustrates a main field and a spare field of an example NAND flash cell array in accordance with example embodiments of the present invention, in more detail. FIG. 11a illustrates a main field region and a spare field region, similar to those shown in FIGS. 10a-10d. As shown, the NAND flash cell array of FIG. 11a may be composed of a number of blocks. Each block may be accessible by a row selector and a column selector. The row selection may be via a word line (WL) and the column selection may be via a bit line (BL). Each block may be divided into two or more groups; a main cell area which may be for a main storage and a spare cell block which may be for control flags and/or redundancy. Program operations may be performed by page unit, which may be a unit of cells commonly connected to a common word line (WL).

Figure 11B:
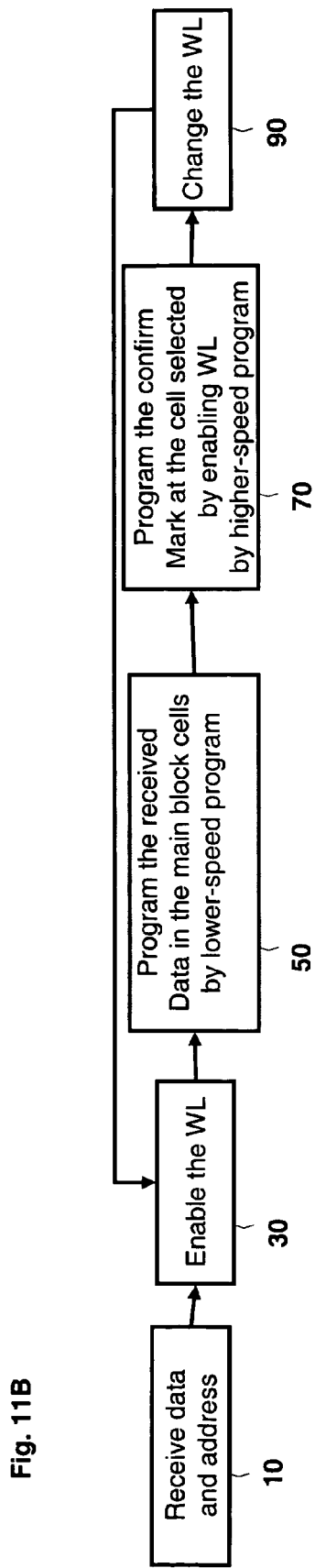
FIG. 11b illustrates a flowchart for writing to a NAND flash cell array in accordance with an example embodiment of the present invention.

FIG. 11b illustrates a flowchart for writing to an example NAND flash cell array in accordance with an example embodiment of the present invention. As shown at 10, the method may include receiving data and an address and enabling the word line (WL) at 30. At 50, the method may include programming the received data in main block cells using a lower-speed program and programming a flag, a control flag, a mark, a control mark, or other control information at the cell selected by enabling the word line (WL) using a higher-speed program at 70. At 90, the word line (WL) may be changed, and flow may then return the word line (WL) to 30 to enable the next word line (WL).

Figure 12A:
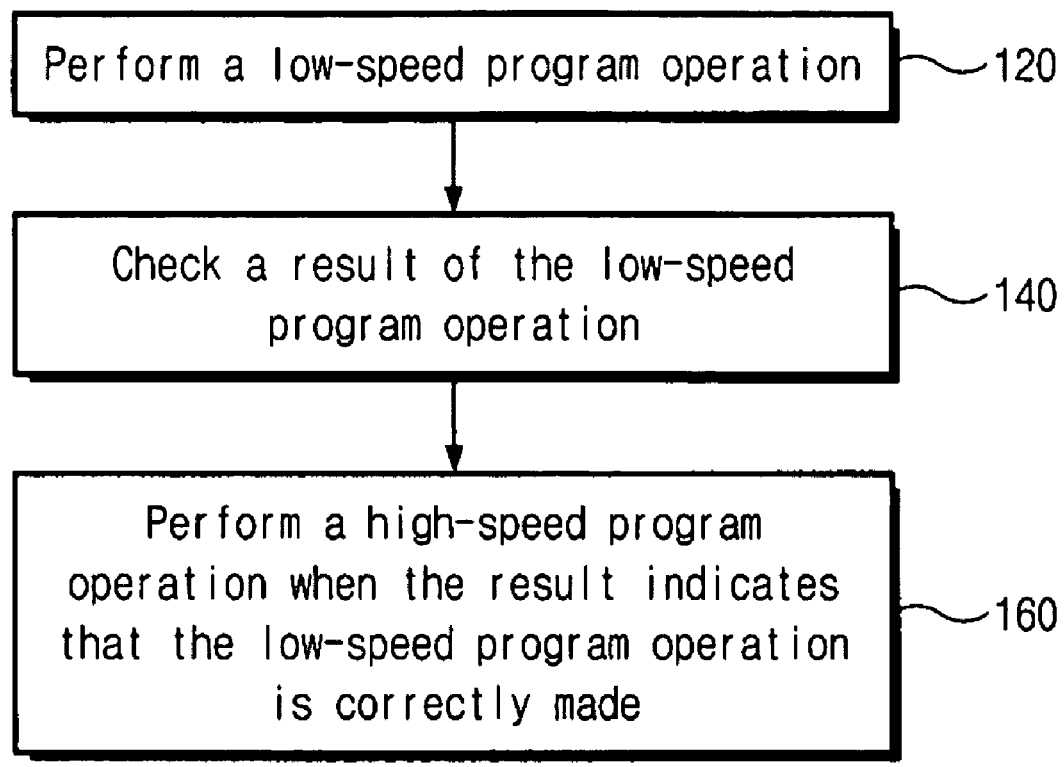
FIGS. 12a and 12b are flowcharts illustrating more general methods of FIGS. 8a and 8b, according to other example embodiments of the present invention.
Figure 12B:
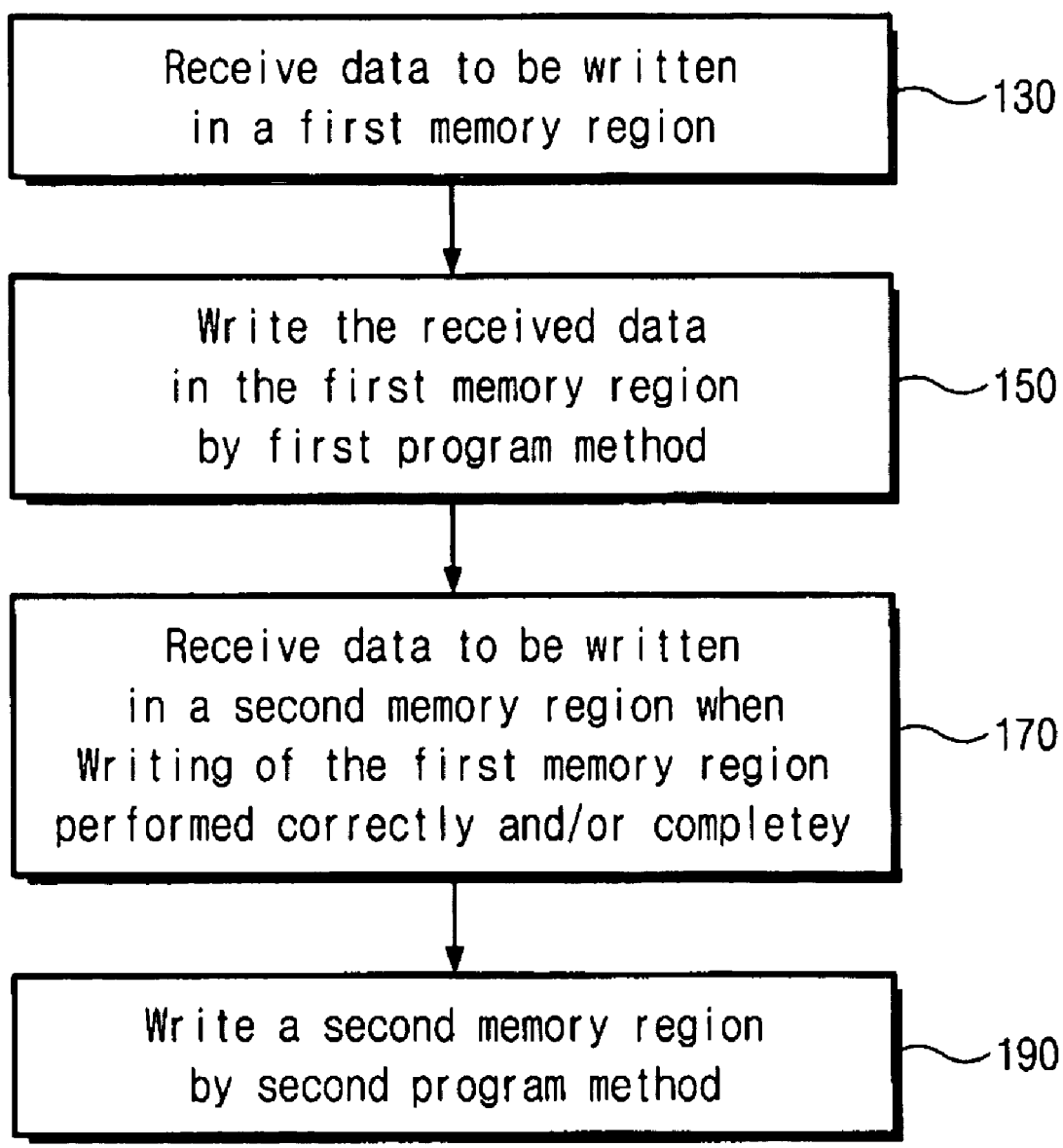

FIGS. 12a and 12b are flowcharts illustrating more general methods of FIGS. 8a and 8b, according to other example embodiments of the present invention. FIG. 12a is a flowchart illustrating a method of performing lower-speed programming and then performing higher-speed programming, after the lower-speed programming has been confirmed to have been performed correctly according to an example embodiment of the present invention. FIG. 12b is a flowchart illustrating a method of receiving and writing first data to a first memory region using a first programming method and receiving and writing second data to a second memory region using a second programming method after the first programming method has been confirmed to have been performed correctly according to an example embodiment of the present invention.

As shown in FIG. 12a, at 120, the method may include performing lower-speed programming. At 140, the method may include checking a result of the lower-speed programming, for example, to determine if the lower-speed programming was performed correctly and/or completely. At 160, the method may include performing higher-speed programming, when at 140, it has been determined that the lower-speed programming was performed correctly and/or completely.

As shown in FIG. 12b, at 130, in another example embodiment, the method may include receiving data to be written in a first memory region. At 150, the method may include writing the data in the first memory region, for example, using a first programming method. At 170, the method may include receiving data to be written in a second memory region, when at 150, it has been determined that the writing in the first memory region was performed correctly and/or completely.

At 190, the method may include writing the data in the second memory region, for example, using a second programming method.

As described above in conjunction with FIG. 12b, the first programming method may be a normal or slower program operation for normal data, the second programming method may be a faster program operation for a flag, a control flag, a mark, a control mark, or other control information data, the first memory region may be a main block of a cell array, and/or the second memory region may be a spare block of a cell array.

Figure 13:
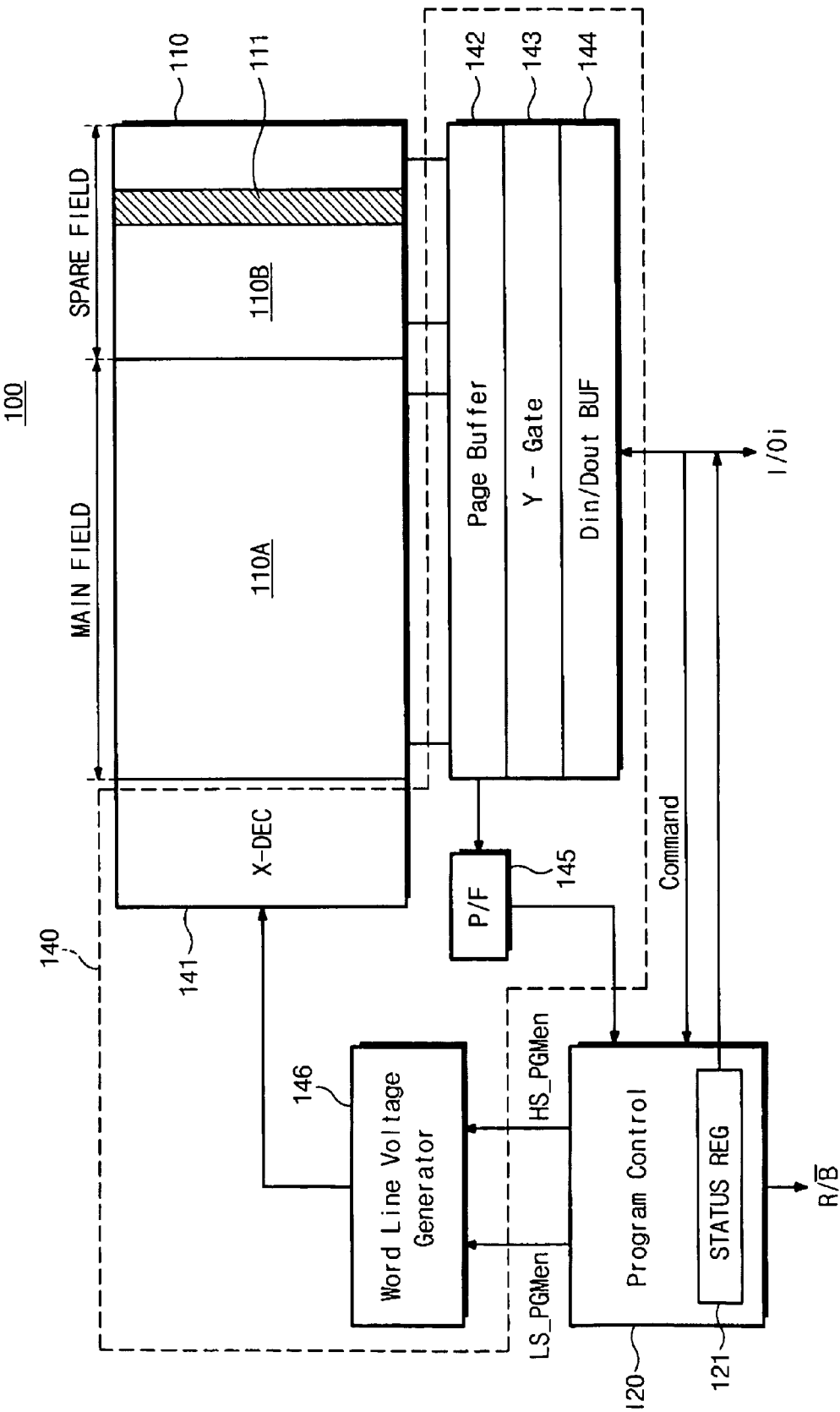
FIG. 13 illustrates a semiconductor memory device according to an example embodiment of the present invention.

FIG. 13 illustrates a semiconductor memory device 100 according to an example embodiment of the present invention. As illustrated in FIG. 13, the semiconductor memory device 100 may include a cell array memory 110 and a memory driver 140. As illustrated in FIGS. 10a-10d, the cell array memory 110 may include a lower speed write region 110A and a higher speed write region 110B. As described above, the lower speed write region 110A may be a main cell storage field, may be written therein with normal or lower speed programming, may be written therein with a full ISPP, and/or may not permit over-programming. As also described above, the higher speed write region 110B may be a spare cell storage field, may be written therein with faster speed programming, may be written therein with a reduced ISPP, may be written therein with one-shot programming, and/or may permit over-programming.

In an example embodiment, the memory driver 140 may include an X-decoder or row decoder 141 for row control and a Y-decoder or column decoder, including page buffer 142, Y-gate 143, and Din/Dout buffer 143, for column control. The semiconductor memory device 100 may also include an overall control circuit, including program control 120 and a word line voltage generator 146 and a program finished (P/F) circuit 145. The program control 120 may include a status register which keeps track of completed operations. An example word line voltage generator 146 is illustrated in more detail in FIG. 14a.

Figure 14A:
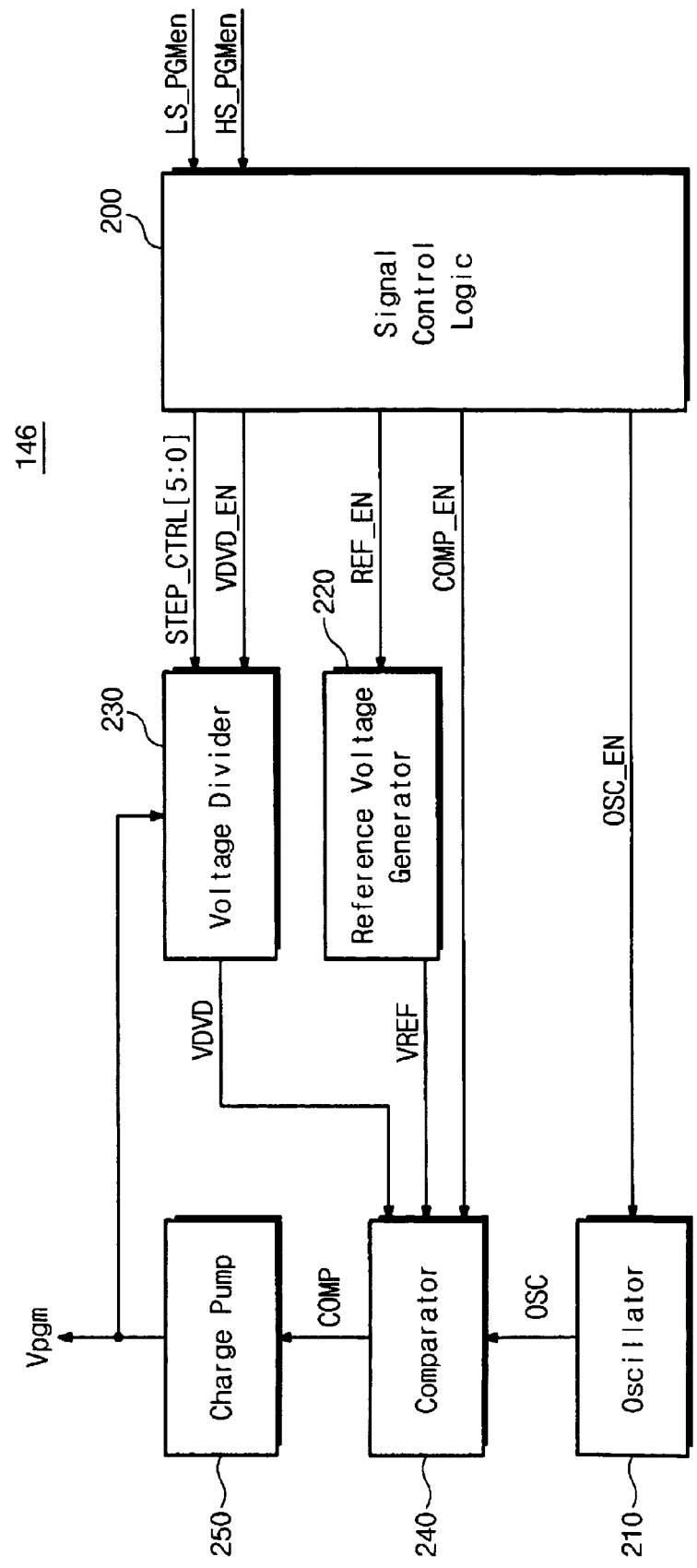
FIG. 14a illustrates a word line voltage generator of the semiconductor memory device of FIG. 13 according to an example embodiment of the present invention.

FIG. 14a illustrates a word line voltage generator 146 of FIG. 13 according to an example embodiment of the present invention. In an example embodiment, the word line voltage generator 146 may include signal control logic, an oscillator 210, a reference voltage generator 220, a voltage divider 230, a comparator 240, and a charge pump 250. As shown, the signal control logic 200 may supply a step signal, STEP_CNTL[5:0] to the voltage divider 230. The voltage divider 230 may generate a variable level signal Vdvd which may be supplied to the comparator 240, along with a reference signal Vref, supplied by the reference voltage generator 220. The comparator compares the voltages Vdvd and Vref and provides the result of the comparison COMP to the charge pump 250 for generation of the desired voltage Vpgm. Vpgm may then be applied to the cell array memory 110, via the X-decoder 141.

Figure 14B:
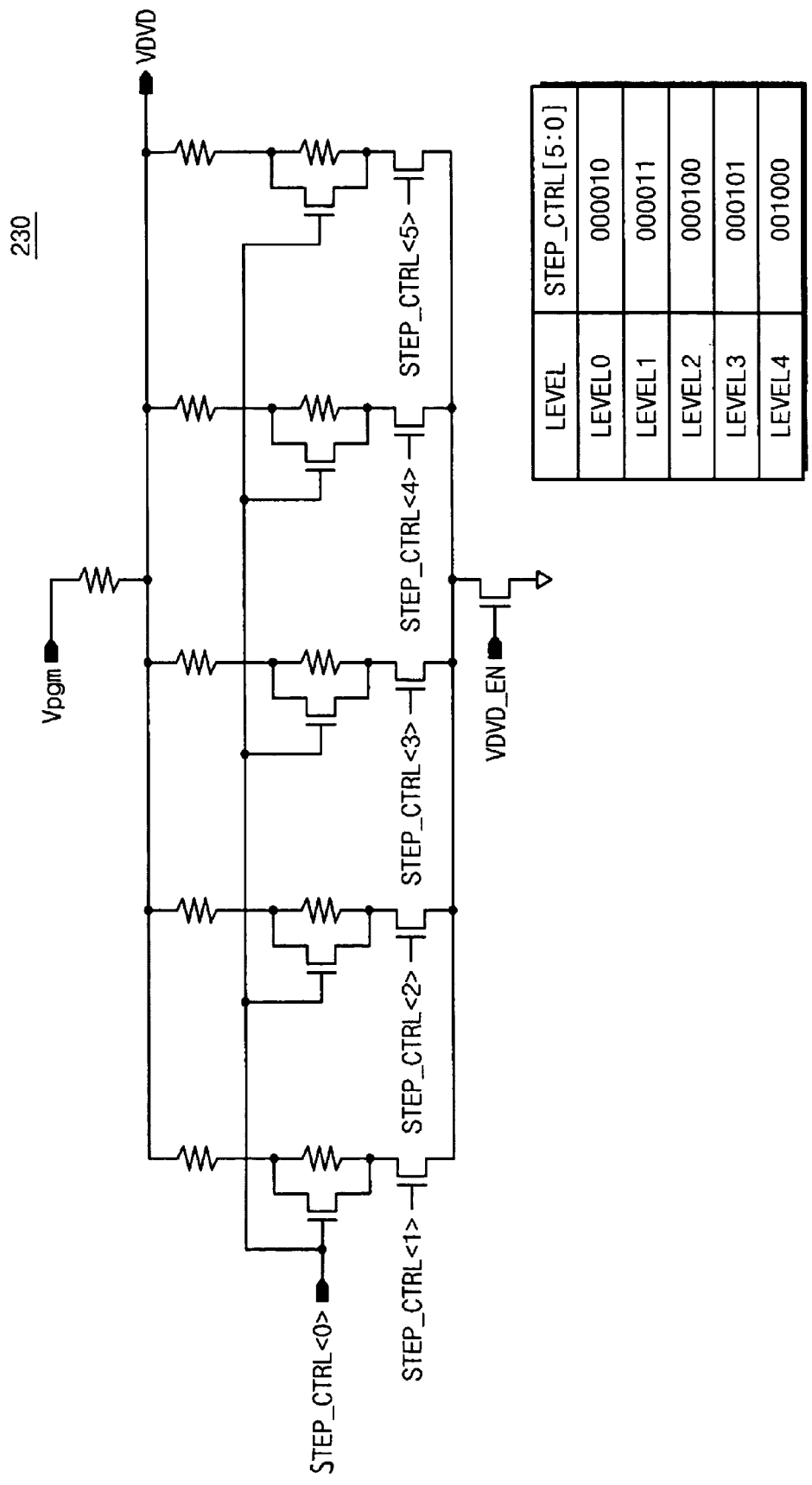
FIG. 14b illustrates a voltage divider of the word line voltage generator of FIG. 14a according to an example embodiment of the present invention.

FIG. 14b illustrates an implementation of the voltage divider 230 of FIG. 14a according to an example embodiment of the present invention. As shown, the voltage divider 230 may be implemented with transistor logic to produce voltages of incremental steps, such as voltages Vpgm1 to Vpgm5 of FIGS. 6a-6c and 9a-9d, based on the step signal STEP_CNTL[5:0] supplied by the signal control logic 200.

Figure 14C:
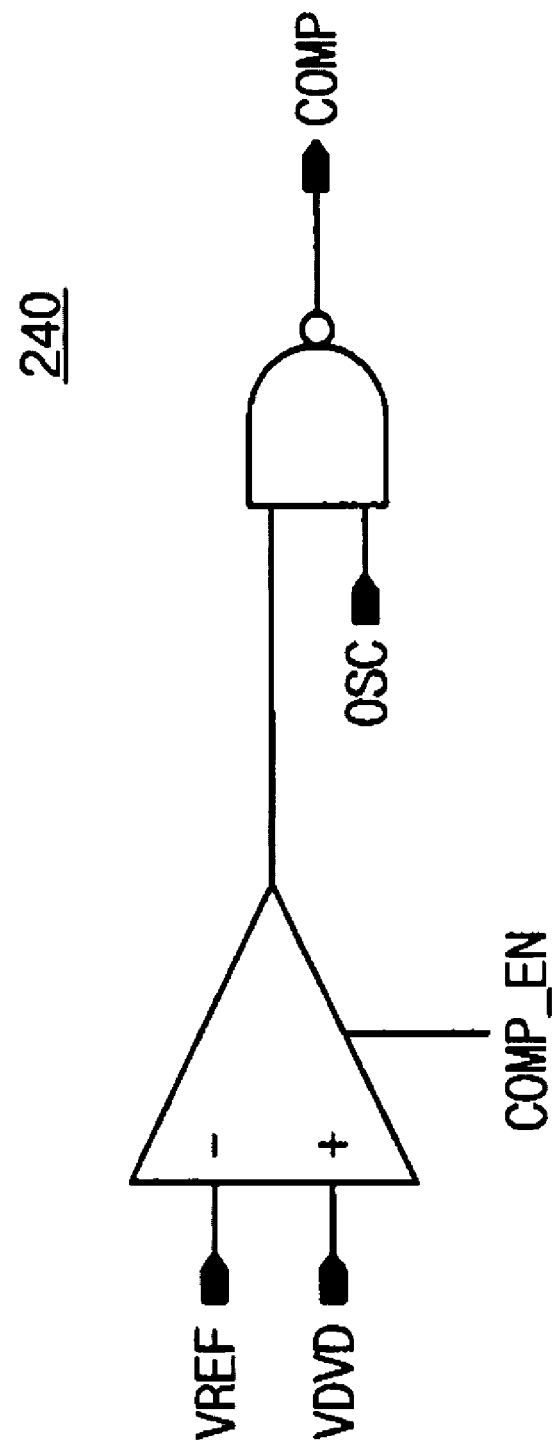
FIG. 14c illustrates a comparator of the word line voltage generator of FIG. 14a according to an example embodiment of the present invention.

FIG. 14c illustrates an implementation of the comparator 240 of FIG. 14a according to an example embodiment of the present invention. As shown, the comparator 240 compares the voltages Vdvd from the voltage divider 230 and Vref from the reference voltage generator 220 under control of an OSC signal from the oscillator 210, and outputs a comparison signal COMP to the charge pump 250.

Figure 15A:
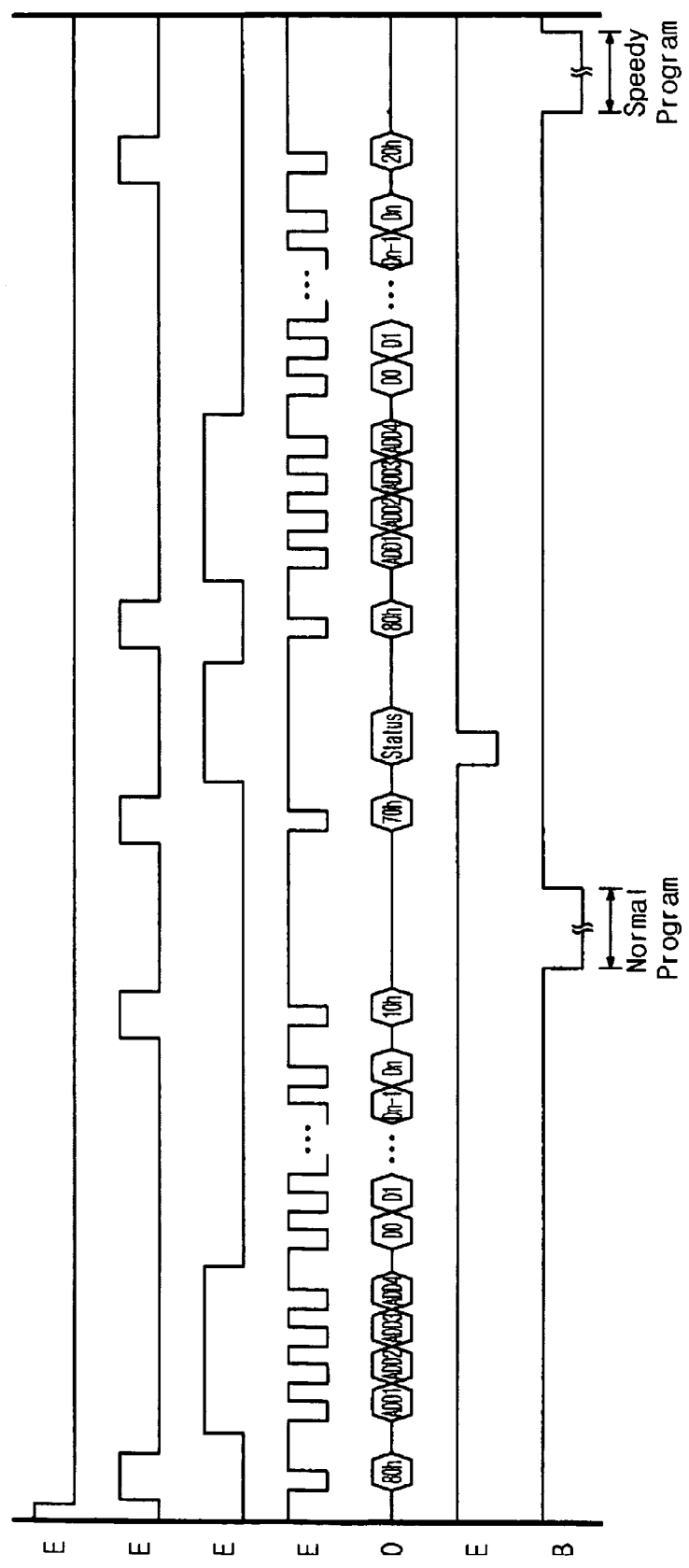
FIGS. 15a and 15b illustrate two timing diagrams of dual program mode operations according to example embodiments of the present invention.
Figure 15B:
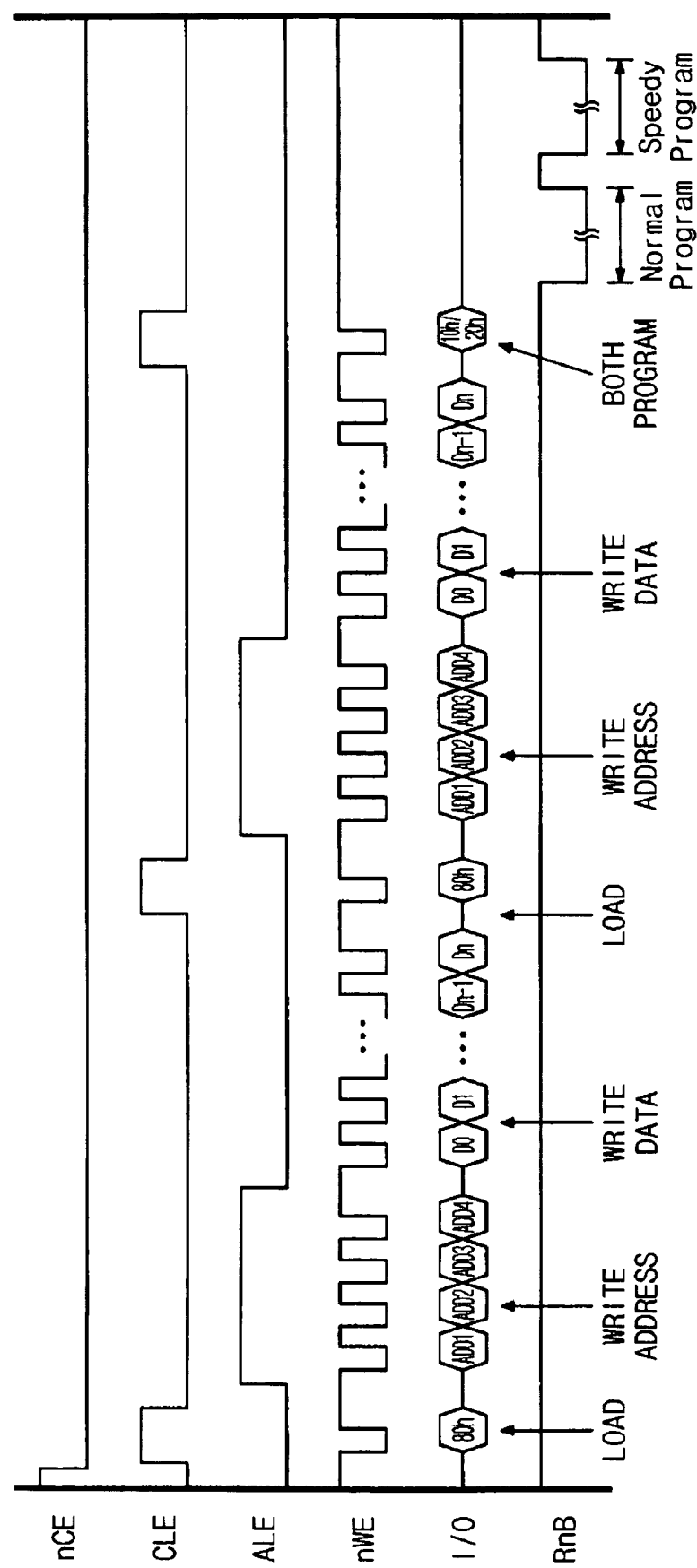

FIGS. 15a and 15b illustrate two timing diagrams of dual program mode operations according to example embodiments of the present invention. As shown in FIG. 15a, first the normal cell data may be written with a normal (or slower) program operation. As illustrated, this may include loading the normal cell data, writing the address for the normal cell data, writing the normal cell data, and executing the normal (or slower) program operation. As illustrated, this may be followed by loading a flag, a control flag, a mark, a control mark, or other control information, writing the address for the flag, the control flag, the mark, the control mark, or other control information, writing the flag, the control flag, the mark, the control mark, or other control information, and executing the faster program operation.

In the example of FIG. 15a, the operations are separated and two separate commands are used to execute the normal (or slower) program operation (10h) and the faster program operation (20h). One advantage of this arrangement is the flexibility provided in being able to separately execute the normal (or slower) program and the faster program.

As shown in FIG. 15b, first the normal cell data may be written with a normal (or slower) program operation. As illustrated, this may include loading the normal cell data (LOAD), writing the address for the normal cell data (WRITE ADDRESS), and writing the normal cell data (WRITE DATA). As illustrated, this may be followed by loading a flag, a control flag, a mark, a control mark, or other control information (LOAD), writing the address for the flag, the control flag, the mark, the control mark, or other control information (WRITE ADDRESS), and writing the flag, the control flag, the mark, the control mark, or other control information (WRITE DATA).

In the example of FIG. 15b, the normal (or slower) program and the faster program are executed together (BOTH PROGRAM) with a common command (10h/20h). One advantage of this arrangement is the total programming time may be shortened.

Example embodiments of the present invention may be semiconductor devices. Example embodiments of the present invention may be non-volatile memory. Example embodiments of the present invention may be flash memory. Example embodiments of the present invention may be NAND or NOR flash memory. Example embodiments of the present invention are applicable to single level cells (SLC) and/or multilevel cells (MLC). Example embodiments of the present invention are applicable to mass storage applications and/or code memory applications.

Example embodiments of the present invention refer to a flag, a control flag, a mark, a control mark, or a confirm flag as examples of types of control information that may be written with a different writing method from normal data and/or a faster writing method than normal data.

Example embodiments of the present invention increment a word line voltage, but other techniques may be utilized as would be known to one of ordinary skill in the art. Example embodiments of the present invention increment a word line voltage four times. It will be appreciated by one of ordinary skill in the art that four is an arbitrary and could be varied substantially and still be within the scope of the present invention.

In example embodiments of the present invention, the word line voltage comprises a program voltage and verify voltage, but other voltages may be utilized as would be known to one of ordinary skill in the art.

Although example embodiments of the present invention have been described with respect to example voltages and example durations, it will be understood by one of ordinary skill in the art that each of these voltages may be varied (including the values mentioned in conjunction with the related art), without departing from the scope and spirit of the invention.

Although example embodiments of the present invention have been described with respect to certain voltages, each of these voltages may be also varied or fixed in value as would be known to one of ordinary skill in the art. For example, increment step pulse programming (ISPP) may be implemented with an initial voltage $V_L$ and N programming steps, where N is an integer, and other pulse programming, may be implemented with an initial voltage $V_H$, and M programming steps, where M is an integer <N. Further, $V_H$ may be greater than, less than or equal to $V_L$.

In another example, increment step pulse programming (ISPP) may be implemented with an initial voltage $V_L$ and N programming steps, where N is an integer and the high-speed programming includes reduced increment step pulse programming (RISPP), with an initial voltage $V_H$, where $V_H > V_L$ and M programming steps, where M is an integer such that 1<M<N. Further, $V_H$ may be greater than, less than or equal to $V_L$.

In another example, the initial voltage $V_H$ of the high-speed programming may be fixed. In another example, the initial voltage $V_H$ of an higher-speed programming operation may depend on a last voltage $V_L$ of the lower-speed programming operation.

Although example embodiments of the present invention have been described as using a logic states 'low' and 'high', it will be understood by one of ordinary skill in the art that these logic states are interchangeable, without departing from the scope and spirit of the invention.

Although example embodiments of the present invention have been described as including NMOS and PMOS transistors, it will be understood by one of ordinary skill in the art that any other circuit implementation may be used, without departing from the scope and spirit of the invention.

It will be apparent to those skilled in the art that other changes and modifications may be made in the above-described example embodiments without departing from the scope of the invention herein, and it is intended that all matter contained in the above description shall be interpreted in an illustrative and not a limiting sense.

We claim:

1. A method of programming, comprising:
performing a lower-speed programming of a given cell type in a first area of memory array;
confirming a result of the lower-speed programming of the given cell type in the first area of memory array; and
performing a higher-speed programming of the given cell type in a second area of memory array after confirming that the result of the lower-speed programming is correct; wherein
an initial programming voltage of the higher-speed programming is different from that of the lower-speed programming,
the initial programming voltage of the higher-speed programming operation is determined based on a last programming voltage of the lower-speed programming operation, and
the higher-speed programming operation performs a control information write operation to write control information indicating that the result of the lower-speed programming operation is correct.

2. The method of claim 1, wherein the given cell type is programmable into only two states.

3. The method of claim 1, wherein the given cell type is programmable into more than two states.

4. The method of claim 1, wherein the lower-speed programming performs a data write operation.

5. The method of claim 4, wherein the data write operation is performed in a main memory field.

6. The method of claim 4, wherein the data write operation is performed in a spare memory field.

7. The method of claim 1, wherein the write control information is a confirm mark write operation.

8. The method of claim 1, wherein the lower-speed programming includes incremental step pulse programming (ISPP) with an initial voltage $V_L$ and N programming steps, where N is an integer, and the higher-speed programming includes reduced incremental step pulse programming (reduced ISPP), with the initial voltage being $V_H$, and M programming steps, where M is an integer <N.

9. The method of claim 8, wherein the higher-speed programming is a programming with M=1 programming steps.

10. The method of claim 8, wherein $V_H > V_L$.

11. The method of claim 8, wherein the initial voltage $V_H$ of the higher-speed programming is fixed.

12. The method of claim 8, wherein the last programming voltage of the higher-speed programming is higher than that of the lower-speed programming.

13. The method of claim 8, wherein the control information write operation is performed in a main memory field.

14. The method of claim 8, wherein the control information write operation is performed in a spare memory field.

15. The method of claim 8, wherein the lower-speed programming and the higher-speed programming are performed by one command.

16. The method of claim 15, wherein the lower-speed programming and the higher-speed programming can be performed independently.

17. The method of claim 8, wherein the lower-speed programming and the higher-speed programming are performed by different commands.

18. The method of claim 17, wherein the lower-speed programming and the higher-speed programming can be performed consecutively.

19. The method of claim 1, wherein the initial voltage of the higher-speed programming is same or greater than the last voltage of the lower-speed programming.

20. The method of claim 1, wherein the initial voltage of the higher-speed programming is less than the last voltage of the lower-speed programming.

21. The method of claim 20, wherein the lower-speed programming has a longer cycle time than the higher-speed programming.

22. The method of claim 1, wherein the initial programming voltage of the higher-speed programming is different from at least one programming voltage used during the lower-speed programming, but the same as a last programming voltage used during the lower-speed programming.

23. The method of claim 1, wherein the initial voltage of the higher-speed programming is determined as a next to last programming voltage of the lower-speed programming operation or the last programming voltage of the lower-speed programming operation.

24. A method of programming, comprising:
performing a first programming of a given cell type in a first area of memory using a first programming method;
confirming a result of the first programming of the given cell type in the first area of memory; and performing a second programming of the given cell type using a second programming method, different from the first programming method, when the result of the first programming is correct; wherein
    an initial programming voltage of the second programming is different from that of the first programming,
    the initial programming voltage of the second programming operation is determined based on a last voltage of the first programming operation, and
    the second programming performs a control information write operation to write control information indicating that the result of the first programming operation is correct.

25. A semiconductor memory device, comprising:
a non-volatile memory cell array including a first area and a second area; and
a controller for performing a lower-speed programming of a given cell type in a first area of the non-volatile memory cell array, confirming a result of the lower-speed programming of the given cell type of the first area, and performing a higher-speed programming of the given cell type in a second area of the non-volatile memory cell array when the result of the lower-speed programming is correct; wherein
    an initial programming voltage of the higher-speed programming is different from that of the lower-speed programming,
    the initial programming voltage of the higher-speed programming operation is determined based on a last voltage of the lower-speed programming operation, and
    the higher-speed programming performs a control information write operation to write control information indicating that the result of the lower-speed programming operation is correct.

26. The semiconductor memory device of claim 25, wherein the lower-speed programming performs a data write operation.

27. The semiconductor memory device of claim 25, wherein the higher-speed programming performs a control flag write operation.

28. The semiconductor memory device of claim 25, the controller further comprising a word line voltage generator for receiving a lower-speed programming enable signal and a higher-speed programming enable signal and supplying a voltage to at least one memory block of the non-volatile memory cell array.

29. The semiconductor memory device of claim 28, wherein the word line voltage generator selectively generates incremental step pulse programming (ISPP) with an initial voltage $V_L$ and N programming steps, where N is an integer, or reduced incremental step pulse programming (reduced ISPP), with an initial voltage $V_H$, and M programming steps, where M is an integer <N.

30. The semiconductor memory device of claim 29, wherein $V_H > V_L$.

31. The semiconductor memory device of claim 29, wherein the higher-speed programming is a programming with M=1 programming steps.

32. The semiconductor memory device of claim 29, wherein the initial voltage $V_H$ of the higher-speed programming is fixed.

33. The semiconductor memory device of claim 29, wherein the initial voltage $V_H$ of the higher-speed programming operation depends on a last voltage of the lower-speed programming operation.

34. The semiconductor memory device of claim 29, wherein $V_H > V_L$.

35. The semiconductor memory device of claim 29, the word line voltage generator further including
    a voltage divider for generating a voltage increment signal for each of the N and M programming steps in ISPP;
    a reference voltage generator which generates a reference voltage for comparing with an output of the voltage divider;
    a comparator which compares the voltage increment signal generated by the voltage divider and a reference voltage to generate a voltage increment and controls the oscillating signal; and
    an oscillator which periodically provides an oscillating signal to the comparator; and,
    a charge pump which supplies a high voltage program voltage for programming operation.

36. The semiconductor memory device of claim 25, wherein the initial voltage of the higher-speed programming is same or greater than the last voltage of the lower-speed programming.

37. The semiconductor memory device of claim 25, wherein the initial voltage of the higher-speed programming is less than the last voltage of the lower-speed programming.

* * * * *